US010509730B2

(12) United States Patent
Cong et al.

(10) Patent No.: US 10,509,730 B2
(45) Date of Patent: Dec. 17, 2019

(54) AGGREGATION OF WRITE TRAFFIC TO A DATA STORE

(71) Applicant: MICROSOFT TECHNOLOGY LICENSING, LLC, Redmond, WA (US)

(72) Inventors: Shi Cong, Issaquah, WA (US); Scott Brender, Kirkland, WA (US); Karan Mehra, Sammamish, WA (US); Darren G. Moss, Redmond, WA (US); William R. Tipton, Seattle, WA (US); Surendra Verma, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 618 days.

(21) Appl. No.: 15/229,025

(22) Filed: Aug. 4, 2016

(65) Prior Publication Data
US 2016/0342528 A1 Nov. 24, 2016

Related U.S. Application Data

(63) Continuation of application No. 13/343,985, filed on Jan. 5, 2012, now Pat. No. 9,448,890, which is a (Continued)

(51) Int. Cl.
*G06F 16/00* (2019.01)
*G06F 12/121* (2016.01)
(Continued)

(52) U.S. Cl.
CPC ........ *G06F 12/121* (2013.01); *G06F 11/1435* (2013.01); *G06F 12/0638* (2013.01);
(Continued)

(58) Field of Classification Search
CPC ............... G06F 12/121; G06F 12/0638; G06F 11/1435; G06F 2212/205;
(Continued)

(56) References Cited

U.S. PATENT DOCUMENTS 3,138,125 A  6/1964 Reaves
4,476,526 A  10/1984 Dodd
(Continued)

FOREIGN PATENT DOCUMENTS

CN  1266229  9/2000
CN  1421003 A  5/2003
(Continued)

OTHER PUBLICATIONS

U.S. Appl. No. 14/530,661, filed Oct. 31, 2014, Kirshenbaum.
(Continued)

*Primary Examiner* — Leslie Wong
(74) *Attorney, Agent, or Firm* — Mark K. Young; Mayer & Williams PC

(57) ABSTRACT

A method and a processing device are provided for sequentially aggregating data to a write log included in a volume of a random-access medium. When data of a received write request is determined to be suitable for sequentially aggregating to a write log, the data may be written to the write log and a remapping tree, for mapping originally intended destinations on the random-access medium to one or more corresponding entries in the write log, may be maintained and updated. At time periods, a checkpoint may be written to the write log. The checkpoint may include information describing entries of the write log. One or more of the checkpoints may be used to recover the write log, at least partially, after a dirty shutdown. Entries of the write log may be drained to respective originally intended destinations upon an occurrence of one of a number of conditions.

17 Claims, 13 Drawing Sheets

Related U.S. Application Data continuation of application No. 13/087,927, filed on Apr. 15, 2011, now Pat. No. 8,108,450, which is a continuation of application No. 12/234,411, filed on Sep. 19, 2008, now Pat. No. 7,953,774.

(51) Int. Cl.
| | | |
|---|---|---|
| G11C 7/10 | (2006.01) | |
| G06F 11/14 | (2006.01) | |
| G06F 12/06 | (2006.01) | |
| G06F 3/06 | (2006.01) | |

(52) U.S. Cl.
CPC .......... *G11C 7/1006* (2013.01); *G06F 3/0611* (2013.01); *G06F 3/0656* (2013.01); *G06F 3/0673* (2013.01); *G06F 11/1471* (2013.01); *G06F 2212/205* (2013.01); *G06F 2212/2022* (2013.01); *G06F 2212/221* (2013.01); *G06F 2212/2228* (2013.01)

(58) Field of Classification Search
CPC ..... G06F 2212/2022; G06F 2212/2228; G06F 3/0611; G06F 11/1471; G06F 3/0673; G06F 3/0656; G06F 2212/221; G11C 7/1006
See application file for complete search history.

(56) References Cited

U.S. PATENT DOCUMENTS

| | | |
|---|---|---|
| 4,612,612 A | 9/1986 | Woffinden |
| 4,671,111 A | 6/1987 | Lemelson |
| 4,945,474 A | 7/1990 | Elliott |
| 4,972,316 A | 11/1990 | Dixon |
| 4,979,108 A | 12/1990 | Crabbe |
| 5,088,026 A | 2/1992 | Bozman |
| 5,175,634 A | 12/1992 | Matsuzaki |
| 5,175,834 A | 12/1992 | Sawai |
| 5,263,136 A | 11/1993 | DeAguiar |
| 5,297,258 A | 3/1994 | Hale et al. |
| 5,307,497 A | 4/1994 | Feigenbaum |
| 5,394,531 A | 2/1995 | Smith |
| 5,398,325 A | 3/1995 | Chang |
| 5,420,998 A | 5/1995 | Horning |
| 5,454,098 A | 9/1995 | Pisello et al. |
| 5,463,739 A | 10/1995 | Albaugh |
| 5,524,230 A | 6/1996 | Sakaue |
| 5,551,002 A | 8/1996 | Rosich et al. |
| 5,557,770 A | 9/1996 | Bhide et al. |
| 5,561,783 A | 10/1996 | Vanka |
| 5,572,660 A | 11/1996 | Jones |
| 5,574,877 A | 11/1996 | Dixit |
| 5,586,290 A | 12/1996 | Hirai |
| 5,603,001 A | 2/1997 | Sukegawa |
| 5,611,067 A | 3/1997 | Okamoto |
| 5,636,355 A | 6/1997 | Ramakrishnan |
| 5,652,857 A | 7/1997 | Shimoi |
| 5,666,532 A | 9/1997 | Saks |
| 5,668,968 A | 9/1997 | Wu |
| 5,717,954 A | 2/1998 | Grieff |
| 5,720,029 A | 2/1998 | Kern |
| 5,740,434 A | 4/1998 | Eastep |
| 5,751,932 A | 5/1998 | Horst |
| 5,751,990 A | 5/1998 | Krolak |
| 5,754,782 A | 5/1998 | Masada |
| 5,754,888 A | 5/1998 | Yang |
| 5,758,056 A | 5/1998 | Barr |
| 5,758,174 A | 5/1998 | Crump |
| 5,764,877 A | 6/1998 | Lomet |
| 5,806,074 A | 9/1998 | Souder |
| 5,809,280 A | 9/1998 | Chard |
| 5,809,543 A | 9/1998 | Byers |
| 5,832,515 A | 11/1998 | Ledain |
| 5,845,293 A | 12/1998 | Veghte |
| 5,860,083 A | 1/1999 | Sukegawa |
| 5,875,466 A | 2/1999 | Wakerly |
| 5,897,638 A | 4/1999 | Lasser |
| 5,897,660 A | 4/1999 | Reinders |
| 5,900,022 A | 5/1999 | Kranich |
| 5,900,870 A | 5/1999 | Malone |
| 5,923,838 A | 7/1999 | Hongo |
| 5,937,433 A * | 8/1999 | Lee ....................... G06F 1/3203 711/118 |
| 5,943,687 A | 8/1999 | Liedberg |
| 5,943,692 A | 8/1999 | Marberg |
| 5,991,847 A | 11/1999 | Ballard |
| 5,996,054 A * | 11/1999 | Ledain ................ G06F 16/1734 711/203 |
| 6,000,006 A | 12/1999 | Bruce |
| 6,018,433 A | 1/2000 | Thayne |
| 6,018,746 A | 1/2000 | Hill |
| 6,021,408 A | 2/2000 | Ledain et al. |
| 6,026,027 A | 2/2000 | Terrell |
| 6,047,291 A | 4/2000 | Anderson |
| 6,073,232 A | 6/2000 | Kroeker |
| 6,092,160 A | 7/2000 | Marsters |
| 6,098,075 A | 8/2000 | Becraft |
| 6,101,601 A | 8/2000 | Matthews |
| 6,108,004 A | 8/2000 | Medl |
| 6,112,024 A | 8/2000 | Almond |
| 6,122,685 A | 9/2000 | Bachmat |
| 6,128,627 A | 10/2000 | Mattis |
| 6,148,368 A | 11/2000 | DeKoning |
| 6,185,629 B1 | 2/2001 | Simpson |
| 6,189,071 B1 | 2/2001 | Bachmat |
| 6,199,195 B1 | 3/2001 | Goodwin |
| 6,209,088 B1 | 3/2001 | Reneris |
| 6,230,233 B1 | 5/2001 | Lofgren |
| 6,237,065 B1 | 5/2001 | Banerjia |
| 6,240,414 B1 | 5/2001 | Beizer |
| 6,247,026 B1 | 6/2001 | Waldo |
| 6,249,841 B1 | 6/2001 | Sikes |
| 6,272,534 B1 | 8/2001 | Guha |
| 6,275,436 B1 | 8/2001 | Tobita |
| 6,298,428 B1 | 10/2001 | Munroe |
| 6,301,365 B1 | 10/2001 | Yamada et al. |
| 6,301,635 B2 | 10/2001 | Bothwell |
| 6,311,232 B1 | 10/2001 | Cagle |
| 6,314,433 B1 | 11/2001 | Mills |
| 6,317,806 B1 | 11/2001 | Audityan |
| 6,318,125 B1 | 11/2001 | Diederen et al. |
| 6,321,234 B1 | 11/2001 | Debrunner |
| 6,338,056 B1 | 1/2002 | Dessloch |
| 6,338,126 B1 | 1/2002 | Ohran |
| 6,345,000 B1 | 2/2002 | Wong |
| 6,360,330 B1 | 3/2002 | Mutalik |
| 6,366,996 B1 | 4/2002 | Hobson |
| 6,370,534 B1 | 4/2002 | Odom |
| 6,370,541 B1 | 4/2002 | Chou |
| 6,378,043 B1 | 4/2002 | Girkar |
| 6,401,093 B1 | 6/2002 | Anand |
| 6,408,058 B1 | 6/2002 | Lanet |
| 6,418,510 B1 | 7/2002 | Lamberts |
| 6,425,057 B1 | 7/2002 | Cherkasova |
| 6,434,682 B1 | 8/2002 | Ashton |
| 6,438,750 B1 | 8/2002 | Anderson |
| 6,454,159 B1 | 9/2002 | Takushima |
| 6,463,509 B1 | 10/2002 | Teoman et al. |
| 6,477,564 B1 | 11/2002 | Freyssinet |
| 6,505,205 B1 | 1/2003 | Kothuri |
| 6,513,051 B1 | 1/2003 | Bolosky |
| 6,516,380 B2 | 2/2003 | Kenchammana-Hoskote et al. |
| 6,519,597 B1 | 2/2003 | Cheng |
| 6,535,949 B1 | 3/2003 | Parker |
| 6,539,456 B2 | 3/2003 | Stewart |
| 6,542,904 B2 | 4/2003 | Crus |
| 6,546,472 B2 | 4/2003 | Atkinson |
| 6,556,983 B1 | 4/2003 | Altschuler |
| 6,557,077 B1 | 4/2003 | Ghosh |
| 6,560,702 B1 | 5/2003 | Gharda |
| 6,567,889 B1 | 5/2003 | Dekoning |
| 6,578,046 B2 | 6/2003 | Chang |
| 6,609,182 B1 | 8/2003 | Pedrizetti |

(56) References Cited

U.S. PATENT DOCUMENTS

| | | |
|---|---|---|
| 6,611,919 B1 | 8/2003 | Matsuya |
| 6,615,313 B2 | 9/2003 | Kato |
| 6,625,742 B1 | 9/2003 | Owhadi et al. |
| 6,629,201 B2 | 9/2003 | Dempsey |
| 6,631,474 B1 * | 10/2003 | Cai ................ G06F 1/3203 713/300 |
| 6,636,942 B2 | 10/2003 | Greco |
| 6,640,278 B1 | 10/2003 | Nolan |
| 6,647,472 B2 | 11/2003 | Atkinson |
| 6,651,141 B2 | 11/2003 | Adrangi |
| 6,671,699 B1 | 12/2003 | Black |
| 6,671,757 B1 | 12/2003 | Muller |
| 6,684,229 B1 | 1/2004 | Luong |
| 6,714,935 B1 | 1/2004 | Delo |
| 6,687,158 B2 | 2/2004 | Yano |
| 6,694,336 B1 | 2/2004 | Multer |
| 6,718,361 B1 | 4/2004 | Basani |
| 6,721,863 B1 | 4/2004 | Endo |
| 6,738,789 B2 | 5/2004 | Multer |
| 6,742,097 B2 | 5/2004 | Woo |
| 6,751,658 B1 | 6/2004 | Haun |
| 6,757,696 B2 | 6/2004 | Multer |
| 6,760,736 B2 | 7/2004 | Waldo |
| 6,769,050 B1 | 7/2004 | Ware |
| 6,771,536 B2 | 8/2004 | Li |
| 6,772,178 B2 | 8/2004 | Mandal |
| 6,775,794 B1 * | 8/2004 | Horst ................ G06F 11/1092 711/114 |
| 6,782,453 B2 | 8/2004 | Keltcher |
| 6,788,612 B2 | 9/2004 | Hsu |
| 6,871,271 B2 | 3/2005 | Ohran |
| 6,877,081 B2 | 4/2005 | Herger |
| 6,879,266 B1 | 4/2005 | Dye |
| 6,901,499 B2 | 5/2005 | Aasheim |
| 6,910,106 B2 | 6/2005 | Sechrest |
| 6,918,022 B2 | 7/2005 | Li et al. |
| 6,920,533 B2 | 7/2005 | Coulson |
| 6,928,521 B1 | 8/2005 | Burton |
| 6,930,919 B2 | 8/2005 | Lee |
| 6,938,116 B2 | 8/2005 | Kim |
| 6,941,423 B2 | 9/2005 | Coulson |
| 6,959,318 B1 | 10/2005 | Tso |
| 6,968,450 B1 | 11/2005 | Rothberg |
| 6,996,660 B1 | 2/2006 | Moore et al. |
| 7,007,072 B1 | 2/2006 | Guha |
| 7,010,645 B2 | 3/2006 | Hetzler |
| 7,017,037 B2 | 3/2006 | Fortin |
| 7,036,040 B2 | 4/2006 | Nicholson |
| 7,039,765 B1 | 5/2006 | Wilkes |
| 7,043,610 B2 | 5/2006 | Horn |
| 7,057,942 B2 | 6/2006 | Suda |
| 7,062,675 B1 | 6/2006 | Kemeny et al. |
| 7,065,627 B2 | 6/2006 | Dayan |
| 7,068,575 B2 | 6/2006 | Gabryjelski |
| 7,082,495 B2 | 7/2006 | DeWhitt |
| 7,082,499 B2 | 7/2006 | Kamitani |
| 7,143,120 B2 | 11/2006 | Oks |
| 7,171,532 B2 | 1/2007 | Kodama |
| 7,185,155 B2 | 2/2007 | Sechrest |
| 7,231,497 B2 | 6/2007 | Trika |
| 7,243,243 B2 * | 7/2007 | Gedeon ................ G06F 1/3203 713/300 |
| 7,284,149 B1 | 10/2007 | Fisher |
| 7,366,740 B2 | 4/2008 | Sleeman |
| 7,366,866 B2 | 4/2008 | Cochran |
| 7,380,090 B2 | 5/2008 | Koseki et al. |
| 7,395,401 B2 | 7/2008 | Sanders |
| 7,409,537 B2 | 8/2008 | Tsang |
| 7,412,369 B1 | 8/2008 | Gupta |
| 7,412,562 B2 | 8/2008 | Garney |
| 7,451,353 B2 | 11/2008 | Grimsrud |
| 7,472,230 B2 | 12/2008 | Prabhu |
| 7,490,197 B2 | 2/2009 | Kirshenbaum |
| 7,574,272 B2 * | 8/2009 | Gibbs ................ 700/94 |
| 7,590,795 B2 * | 9/2009 | Sinclair ................ G06F 3/0605 711/103 |
| 7,620,983 B1 | 11/2009 | Satish |
| 7,631,140 B2 | 12/2009 | Saito |
| 7,644,239 B2 | 1/2010 | Ergan |
| 7,698,506 B1 | 4/2010 | Fair |
| 7,698,513 B2 | 4/2010 | Sechrest |
| 7,774,508 B2 | 8/2010 | Nakamura |
| 7,805,571 B2 | 9/2010 | Kirshenbaum |
| 7,814,261 B2 | 10/2010 | Lee |
| 7,818,701 B1 | 10/2010 | Kolokowsky |
| 7,849,502 B1 | 12/2010 | Bloch et al. |
| 7,873,782 B2 | 1/2011 | Terry et al. |
| 7,945,734 B2 | 5/2011 | Lahcanski |
| 7,953,774 B2 | 5/2011 | Cong |
| 8,006,037 B2 | 8/2011 | Kirshenbaum |
| RE42,727 E | 9/2011 | Kang |
| 8,032,707 B2 | 10/2011 | Iyigun |
| 8,032,723 B2 | 10/2011 | Sechrest |
| 8,041,904 B2 | 10/2011 | Ergan |
| 8,074,014 B2 | 12/2011 | Narayanan et al. |
| 8,108,450 B2 | 1/2012 | Cong |
| 8,135,914 B2 | 3/2012 | Iyigun |
| 8,255,645 B2 | 8/2012 | Ergan |
| 8,352,464 B2 | 1/2013 | Fotev |
| 8,539,186 B2 | 9/2013 | Sechrest |
| 8,631,203 B2 | 1/2014 | Fortin et al. |
| 8,756,375 B2 | 6/2014 | Flynn |
| 8,909,861 B2 | 12/2014 | Kirshenbaum |
| 9,690,496 B2 | 6/2017 | Kirshenbaum et al. |
| 2001/0007123 A1 | 7/2001 | Seguchi |
| 2001/0007999 A1 | 7/2001 | Rasmussen |
| 2001/0028603 A1 | 10/2001 | Shimazu |
| 2001/0047462 A1 | 11/2001 | Dimitroff |
| 2002/0004876 A1 | 1/2002 | Timmer |
| 2002/0008779 A1 | 1/2002 | Pil-Sang et al. |
| 2002/0073276 A1 | 1/2002 | Howard |
| 2002/0083275 A1 | 6/2002 | Kawamoto |
| 2002/0087797 A1 | 7/2002 | Adrangi |
| 2002/0087816 A1 | 7/2002 | Atkinson |
| 2002/0091702 A1 | 7/2002 | Mullins |
| 2002/0108017 A1 | 8/2002 | Kenchammana-Hoskote |
| 2002/0143521 A1 | 10/2002 | Call |
| 2002/0152422 A1 | 10/2002 | Sharma |
| 2002/0156970 A1 | 10/2002 | Stewart |
| 2002/0171966 A1 | 11/2002 | Ottesen |
| 2002/0178326 A1 | 11/2002 | Ohta |
| 2002/0184311 A1 | 12/2002 | Traversat |
| 2002/0198891 A1 | 12/2002 | Li |
| 2002/0199075 A1 | 12/2002 | Jacobs |
| 2003/0009538 A1 | 1/2003 | Shah |
| 2003/0041213 A1 | 2/2003 | Tokar |
| 2003/0070065 A1 | 4/2003 | Fleming |
| 2003/0074524 A1 | 4/2003 | Coulson |
| 2003/0074550 A1 | 4/2003 | Wilks |
| 2003/0101320 A1 | 5/2003 | Chauvel |
| 2003/0110357 A1 | 6/2003 | Nguyen |
| 2003/0125886 A1 * | 7/2003 | Spitaels ................ H02J 3/14 702/62 |
| 2003/0154314 A1 | 8/2003 | Mason, Jr. |
| 2003/0154337 A1 | 8/2003 | Ohno |
| 2003/0158839 A1 | 8/2003 | Faybishenko |
| 2003/0177305 A1 | 9/2003 | Hetrick |
| 2003/0191916 A1 | 10/2003 | McBrearty |
| 2003/0202377 A1 | 10/2003 | Harari |
| 2003/0210601 A1 * | 11/2003 | Lin ................ G11C 5/141 365/229 |
| 2003/0212660 A1 | 11/2003 | Kerwin |
| 2003/0212857 A1 | 11/2003 | Pacheco |
| 2003/0217299 A1 | 11/2003 | Neuman |
| 2004/0003003 A1 | 1/2004 | McCartney |
| 2004/0003223 A1 | 1/2004 | Fortin |
| 2004/0010639 A1 | 1/2004 | Inoue |
| 2004/0015504 A1 | 1/2004 | Ahad |
| 2004/0019762 A1 | 1/2004 | Fukuoka |
| 2004/0024795 A1 | 2/2004 | Hind |
| 2004/0034765 A1 | 2/2004 | O'Connell |
| 2004/0044776 A1 | 3/2004 | Larkin |
| 2004/0044849 A1 | 3/2004 | Stence et al. |

(56) References Cited

U.S. PATENT DOCUMENTS

| | | |
|---|---|---|
| 2004/0059747 A1 | 3/2004 | Olarig |
| 2004/0064647 A1 | 4/2004 | Dewhitt et al. |
| 2004/0068627 A1 | 4/2004 | Sechrest |
| 2004/0078508 A1 | 4/2004 | Rivard |
| 2004/0093463 A1 | 5/2004 | Shang |
| 2004/0103238 A1 | 5/2004 | Avraham |
| 2004/0107200 A1 | 6/2004 | Sjogren |
| 2004/0136259 A1 | 7/2004 | Klint |
| 2004/0148611 A1 | 7/2004 | Manion |
| 2004/0153694 A1 | 8/2004 | Nicholson |
| 2004/0162950 A1 | 8/2004 | Coulson |
| 2004/0168018 A1 | 8/2004 | Aasheim |
| 2004/0172576 A1 | 9/2004 | Yoshii |
| 2004/0174631 A1 | 9/2004 | Tanaka |
| 2004/0202073 A1* | 10/2004 | Lai .................. G06F 3/0625 369/47.33 |
| 2004/0221030 A1 | 11/2004 | Huras et al. |
| 2004/0221089 A1 | 11/2004 | Sato |
| 2004/0230743 A1 | 11/2004 | Ware |
| 2004/0243612 A1 | 12/2004 | Bailey |
| 2004/0267787 A1 | 12/2004 | Huras et al. |
| 2005/0005188 A1 | 1/2005 | Hsu |
| 2005/0021907 A1 | 1/2005 | Shimada |
| 2005/0111260 A1 | 5/2005 | Nazarian |
| 2005/0125708 A1 | 6/2005 | Simon |
| 2005/0138282 A1 | 6/2005 | Garney et al. |
| 2005/0138283 A1 | 6/2005 | Garney |
| 2005/0141284 A1 | 6/2005 | Futatsuyama |
| 2005/0145923 A1 | 7/2005 | Chen |
| 2005/0149750 A1 | 7/2005 | Lisanke |
| 2005/0160223 A1 | 7/2005 | Chen |
| 2005/0160233 A1 | 7/2005 | Van Doren et al. |
| 2005/0172067 A1 | 8/2005 | Sinclair |
| 2005/0193160 A1 | 9/2005 | Bhatt |
| 2005/0204091 A1 | 9/2005 | Kilbuck |
| 2005/0228964 A1 | 10/2005 | Sechrest |
| 2005/0235119 A1 | 10/2005 | Sechrest |
| 2005/0239494 A1 | 10/2005 | Klassen |
| 2005/0246487 A1 | 11/2005 | Ergan |
| 2005/0251617 A1 | 11/2005 | Sinclair |
| 2005/0262378 A1 | 11/2005 | Sleeman |
| 2005/0268038 A1 | 12/2005 | Yasue |
| 2005/0278481 A1 | 12/2005 | Lakhani et al. |
| 2005/0286855 A1 | 12/2005 | Saitou |
| 2006/0010293 A1 | 1/2006 | Schnapp |
| 2006/0074953 A1 | 4/2006 | Dettinger |
| 2006/0075185 A1 | 4/2006 | Azzarito |
| 2006/0080553 A1 | 4/2006 | Hall |
| 2006/0087893 A1 | 4/2006 | Nishihara |
| 2006/0090031 A1 | 4/2006 | Kirshenbaum |
| 2006/0106889 A1 | 5/2006 | Mannby |
| 2006/0112195 A1 | 5/2006 | Aoyama |
| 2006/0112215 A1 | 5/2006 | Kim |
| 2006/0136472 A1 | 6/2006 | Jujjuri |
| 2006/0136664 A1 | 6/2006 | Trika |
| 2006/0143241 A1 | 6/2006 | Bradshaw |
| 2006/0155931 A1 | 7/2006 | Birrell |
| 2006/0177067 A1 | 8/2006 | Kim |
| 2006/0212644 A1 | 9/2006 | Acton et al. |
| 2006/0212651 A1* | 9/2006 | Ashmore .......... G06F 11/1441 711/113 |
| 2006/0236034 A1 | 10/2006 | Pomaranski |
| 2006/0248276 A1 | 11/2006 | Kilian |
| 2006/0248387 A1 | 11/2006 | Nicholson |
| 2006/0277359 A1 | 12/2006 | Faber |
| 2007/0005882 A1 | 1/2007 | Gallagher |
| 2007/0011405 A1 | 1/2007 | Adusumilli |
| 2007/0033356 A1 | 2/2007 | Erlikhman |
| 2007/0035632 A1* | 2/2007 | Silvernail .......... G07C 5/085 348/211.3 |
| 2007/0043787 A1 | 2/2007 | Cannon |
| 2007/0043929 A1 | 2/2007 | Safford |
| 2007/0061511 A1 | 3/2007 | Faber |
| 2007/0061577 A1 | 3/2007 | Van De Kerkhof et al. |
| 2007/0073764 A1 | 3/2007 | Oks |
| 2007/0150966 A1 | 6/2007 | Kirschner |
| 2007/0156954 A1 | 7/2007 | Trika |
| 2007/0162700 A1 | 7/2007 | Fortin |
| 2007/0207800 A1 | 9/2007 | Daley et al. |
| 2007/0208910 A1 | 9/2007 | Koseki et al. |
| 2007/0233939 A1 | 10/2007 | Kim |
| 2007/0266199 A1 | 11/2007 | Peled |
| 2007/0294474 A1 | 12/2007 | Panabaker |
| 2007/0294504 A1 | 12/2007 | Peled |
| 2008/0010401 A1 | 1/2008 | Royer |
| 2008/0010415 A1 | 1/2008 | Sawdey |
| 2008/0109625 A1 | 5/2008 | Erlingsson |
| 2008/0162485 A1 | 7/2008 | Long |
| 2008/0172519 A1 | 7/2008 | Shmulevich |
| 2008/0183958 A1 | 7/2008 | Cheriton |
| 2009/0112949 A1 | 4/2009 | Ergan |
| 2009/0144495 A1 | 6/2009 | Kirshenbaum |
| 2009/0150335 A1 | 6/2009 | Latorre |
| 2009/0150599 A1 | 6/2009 | Bennett |
| 2009/0150611 A1 | 6/2009 | Fortin |
| 2009/0287890 A1 | 11/2009 | Bolosky |
| 2010/0007047 A1 | 1/2010 | Lau |
| 2010/0037001 A1 | 2/2010 | Langlois et al. |
| 2010/0070101 A1 | 3/2010 | Benes et al. |
| 2010/0070701 A1 | 3/2010 | Iyigun |
| 2010/0070747 A1 | 3/2010 | Iyigun |
| 2010/0082550 A1 | 4/2010 | Cong |
| 2010/0194341 A1* | 8/2010 | Anupindi ............ G06F 1/263 320/118 |
| 2010/0199043 A1 | 8/2010 | Sechrest |
| 2010/0199063 A1 | 8/2010 | Sechrest |
| 2010/0217929 A1 | 8/2010 | Kirshenbaum |
| 2010/0280999 A1 | 11/2010 | Atluri et al. |
| 2011/0197016 A1 | 8/2011 | Cong |
| 2011/0276743 A1 | 11/2011 | Kirshenbaum |
| 2011/0314202 A1 | 12/2011 | Iyigun |
| 2012/0047323 A1 | 2/2012 | Sareen |
| 2012/0102265 A1 | 4/2012 | Cong |
| 2012/0173824 A1 | 7/2012 | Iyigun |
| 2012/0290785 A1 | 11/2012 | Ergan |
| 2014/0047189 A1 | 2/2014 | Fortin |
| 2015/0106557 A1* | 4/2015 | Yu .................. G11C 16/3431 711/103 |
| 2016/0210058 A1 | 7/2016 | Kirshenbaum et al. |
| 2017/0052892 A1 | 2/2017 | Fortin et al. |
| 2017/0132136 A1 | 5/2017 | Ergan et al. |

FOREIGN PATENT DOCUMENTS

| | | |
|---|---|---|
| CN | 1465009 | 12/2003 |
| CN | 101236530 A | 8/2008 |
| EP | 0547992 A2 | 6/1993 |
| EP | 0712067 | 5/1996 |
| EP | 0744697 | 11/1996 |
| EP | 1 960 888 B1 | 1/2013 |
| JP | 57-161933 A | 10/1982 |
| JP | 60-140446 A | 7/1985 |
| JP | S60140466 A | 7/1985 |
| JP | S62247853 A | 10/1987 |
| JP | S63247853 A | 10/1988 |
| JP | 01-303547 | 12/1989 |
| JP | 02-039256 | 2/1990 |
| JP | 03-147157 A | 6/1991 |
| JP | 03-294942 | 12/1991 |
| JP | 04-205634 A | 7/1992 |
| JP | 04-246746 | 9/1992 |
| JP | 05-059537 U | 3/1993 |
| JP | 05-062329 | 3/1993 |
| JP | 05-064931 | 3/1993 |
| JP | 05-094353 | 4/1993 |
| JP | 05-158797 | 6/1993 |
| JP | 05-225066 | 9/1993 |
| JP | H05233392 A | 9/1993 |
| JP | 05-282889 | 10/1993 |
| JP | 06-035802 | 2/1994 |
| JP | 06-083708 | 3/1994 |
| JP | 06-231043 | 8/1994 |
| JP | 06-236351 | 8/1994 |
| JP | H06324817 A | 11/1994 |

(56) References Cited

FOREIGN PATENT DOCUMENTS

| JP | 07-253935 | 10/1995 |
|---|---|---|
| JP | 08-263380 | 10/1996 |
| JP | 09-106366 | 4/1997 |
| JP | 09-146710 | 6/1997 |
| JP | 09-190382 | 7/1997 |
| JP | 09-214028 | 8/1997 |
| JP | 10-040170 | 2/1998 |
| JP | 10-091488 | 4/1998 |
| JP | 10-154101 | 6/1998 |
| JP | 10-289155 | 10/1998 |
| JP | 11-259361 | 9/1999 |
| JP | 11-316699 A | 11/1999 |
| JP | 11-338641 | 12/1999 |
| JP | 2000-148515 A | 5/2000 |
| JP | 2000194645 A | 7/2000 |
| JP | 2000-235544 | 8/2000 |
| JP | 2001-027967 | 1/2001 |
| JP | 2001500293 A | 1/2001 |
| JP | 2001-067258 | 3/2001 |
| JP | 2001-250315 | 9/2001 |
| JP | 2001243021 A | 9/2001 |
| JP | 2002-007185 A | 1/2002 |
| JP | 2002121138 A | 4/2002 |
| JP | 2002-259186 | 9/2002 |
| JP | 2002-342037 A | 11/2002 |
| JP | 2002323959 A | 11/2002 |
| JP | 2003-076498 | 3/2003 |
| JP | 2003-085041 | 3/2003 |
| JP | 2003-196032 | 7/2003 |
| JP | 2003-280950 | 10/2003 |
| JP | 2003-316647 A | 11/2003 |
| JP | 2004-021370 | 1/2004 |
| JP | 2004-054845 | 2/2004 |
| JP | 2004-192403 | 7/2004 |
| JP | 2004-272324 | 9/2004 |
| JP | 2004272764 A | 9/2004 |
| JP | 2005-044010 | 2/2005 |
| JP | 2005-222383 | 8/2005 |
| JP | 2005339256 A | 12/2005 |
| JP | 2007-007185 | 1/2007 |
| JP | 2007233896 A | 9/2007 |
| JP | 2008-052321 | 3/2008 |
| JP | 4205634 B2 | 1/2009 |
| KR | 10-1999-0019377 | 3/1999 |
| KR | 10-2000-0039727 | 7/2000 |
| RU | 2010317 | 3/1994 |
| RU | 2096824 C1 | 11/1997 |
| RU | 2189073 C2 | 9/2002 |
| SU | 737952 A1 | 5/1980 |
| SU | 1575192 A1 | 6/1990 |
| TW | 190585 | 9/1992 |
| TW | 347515 | 12/1998 |
| TW | 479194 | 3/2002 |
| TW | 502165 | 9/2002 |
| TW | 200402628 A | 2/2004 |
| TW | 200405170 A | 4/2004 |
| TW | 1347515 | 8/2011 |
| WO | WO 93/18461 | 9/1993 |
| WO | 97/26600 A1 | 7/1997 |
| WO | 98/10611 | 3/1998 |
| WO | 9953439 A2 | 10/1999 |
| WO | 0049488 A1 | 8/2000 |
| WO | WO 01/11486 | 2/2001 |
| WO | WO 01/57675 | 8/2001 |
| WO | WO 01/75581 | 10/2001 |
| WO | 02/01365 A2 | 1/2002 |
| WO | WO 02/01364 | 1/2002 |

OTHER PUBLICATIONS

U.S. Appl. No. 14/708,525, filed May 11, 2015, Iyigun.
"Office Action Issued in European Patent Application No. 09813565.0", dated Dec. 19, 2018, 2 Pages.
"SN74V263, SN74V273, SN74V283, SN74V293 8192 × 18,16384 × 18, 32768 × 18, 65536 × 18 3.3.V CMOS First-In, First-Out Memories", Description Published by Texas Instruments Incorporation, Jun. 2001, 52 Pages.
"Office Action Issued in Indian Patent Application No. 01942/DELNP/2011", dated Aug. 27, 2018, 5 Pages.
"Office Action Issued in European Patent Application No. 09813565.0", dated Sep. 1, 2017, 5 Pages.
"Office Action Issued in European Patent Application No. 09826570.5", dated Oct. 11, 2016, 6 Pages.
"Office Action Issued in Indian Patent Application No. 1152/DEL/2003", dated Nov. 28, 2017, 6 Pages.
"Final Office Action Issued in U.S. Appl. No. 15/340,826", dated Jun. 12, 2017, 14 Pages.
"Final Office Action Issued in U.S. Appl. No. 15/340,826", dated Apr. 12, 2018, 13 Pages.
"Non Final Office Action Issued in U.S. Appl. No. 15/340,826", dated Nov. 16, 2018, 10 Pages.
"Non Final Office Action Issued in U.S. Appl. No. 15/340,826", dated Oct. 19, 2017, 13 Pages.
"Non Final Office Action Issued in U.S. Appl. No. 15/340,826", dated Jan. 12, 2017, 12 Pages.
"Office Action Issued in Israel Patent Application No. 191502", dated Nov. 3, 2011, 4 Pages.
"Office Action Issued in Indian Patent Application No. 1985/CHENP/2011", dated Aug. 28, 2018, 5 Pages.
"Decision on Reexamination Issued in Chinese Patent Application No. 200680047384.6", dated Mar. 30, 2011, 2 Pages.
"Office Action Issued in Indian Patent Application No. 878/MUMNP/2011", dated Sep. 26, 2018, 5 Pages.
"Office Action Issued Brazilian Patent Application No. BR122016001493-2", dated Apr. 2, 2018, 5 Pages.
"Office Action Issued in Brazilian Patent Application No. BR122016001493-2", dated Apr. 12, 2016, 7 Pages.
"Office Action Issued in Brazilian Patent Application No. BR122016001493-2", dated Aug. 3, 2016, 5 Pages.
"Office Action Issued in Brazilian Patent Application No. BR122016001493-2", dated Nov. 30, 2017, 7 Pages.
"Second Office Action Issued in Chinese Patent Application No. 200680047384.6", dated May 12, 2011, 10 Pages.
U.S. Appl. No. 14/259,065, filed Apr. 22, 2014, Shi Cong.
"Office Action Issued in European Patent Application No. 09814983.4", dated Dec. 15, 2016, (7 Pages total).
Anderson, "A Case for Buffer Servers", Proceedings of the Seventh Workshop on Hot Topics in Operating Systems, Mar. 28-30, 1999.
Andrews, "Combining Language and Database Advances in an Object-Oriented Development Environment", Conference on Object-Oriented Programming Systems, Languages, and Applications(OOPSLA'87), Oct. 4-8, 1987.
Beard, "Multilevel and Graphical Views of Metadata", Fifth International Forum on Research and Technology Advances in Digital Libraries, Apr. 22-24, 1998.
Beitner, "Multimedia Support and Authoring in Microcosm: an extended model", 1994.
Berg, "How Do I Create Persistent Java Objects?". Dr. Dobb's Journal, Apr. 1997.
Bhattacharya, "Coordinating Backup/Recovery and Data Consistency Between Database and File Systems", Proceedings of the 2002 ACM SIGMOD International Conference on Management of Data, Jun. 3-6, 2002.
Billiris, "The Performance of Three Database Storage Structures for Managing Large Obkects", Proceedings of the 1992 ACM SIGMOD International Conference on Management of Data, Jun. 2-5, 1992.
Booch, "Object-Oriented Analysis and Design with Applications", The Benjamin/Cummings Publishing Company, Inc., 1994.
Bracchi, "Binary Logical Associations in Data Modelling", Modelling in Data Base Management Systems, Proceedings of the IFIP Working Conference on Modelling in Data Base Management Systems, Jan. 5-8, 1976.
Bullock, "Recovery of Data Pages After Partial Page Writes", IBM Technical Disclosure Bulletin, Aug. 1, 1991.
Buneman, "Inheritance and Persistance in Database Programming Languages", Proceedings of the 1986 ACM SIGMOD International Conference on Management of Data, May 28-30, 1986.

(56) References Cited

OTHER PUBLICATIONS

Cammarata, "Extending a Relational Database with Deferred Referential Integrity Checking and Intelligent Joins", Proceedings of the 1989 ACM SIGMOD International Conference on Management of Data, May 31-Jun. 2, 1989.
Chien, "Concurrent Aggregates (CA), Design and Experience with a Concurrent Object-Oriented Language Based on Aggregates", Journal of Parallel and Distributed Computing, Mar. 1995.
Chryssostomidis, "Geometric Modeling Issues in Computer Aided Design of Marine Structures", Marine Technology Society Journal, vol. 22, No. 2, Dec. 1986.
Ciocozzi, "Microsoft Press Computer Dictionary", Third Edition, 1997.
CN Notice on First Office Action for Application No. 200510063792.4, dated Feb. 1, 2008.
CN Notice on First Office Action for Application No. 200510116208.0, dated Jun. 6, 2008.
CN The Second Office Action for Application No. 200510083792.4, dated Jun. 27, 2008.
CN The First Office Action for Application No. 200680047384.6, dated Jan. 22, 2010.
CN Decision on Rejection for Application No. 200680047384.6, dated Nov. 11, 2010.
CN Notice on the First Office Action for Application No. 200960197190.9, dated Oct. 24, 2012.
"Computervision Launches Design Automation Development Platform for Windows, UNIX Desktop Applications", PR Newswire, Jan. 10, 1995.
D'Andrea, "UniSQL's Next-Generation Object-Relational Database Management System", Proceedings of the 1996 ACM SIGMOD International Conference on Management of Data, vol. 25, No. 3, Sep. 1996.
Darby, "Object Serialization in Java 1.1: Making Objects Persistent", WEB Techniques, Sep. 1997.
"Developer's Guide to Apple Data Detectors—For Version 1.0.2", Apple Computer, Inc., Dec. 1, 1997.
Dietrich, Jr., "TGMS: An Object-Oriented System for Programming Geometry", Software-Practice and Experience, Oct. 1989.
Dobashi, "Skylight for Interior Lighting Design", Eurographics '94 Conference Proceedings, vol. 13, No. 3, 1994.
Dorsch, "Accel signs with IBM to buy Altium PCB unit—Accel Technologies acquires the assets to Altium's P-CAD business unit", LookSmart's FindArticles, Electronic News, Jan. 16, 1995.
EP Communication for Application No. 05103697.8-2201, Reference EP34979TE900dfi, dated May 21, 2007.
EP Communication for Application No. 05109295.5-2201, Reference EP 36830RK900dfi, dated Jun. 8, 2007.
EP Communication for Application No. 03022573.4-1229, Reference EP28554-/df, dated Aug. 2, 2007.
EP Communication for Application No. 05103697.8-2201, Reference EP34979TE900dfi, dated Oct. 26, 2007.
EP Communication for Application No. 03022573.1-1229, Reference EP28554-/df, dated Nov. 8, 2007.
EP Communication for Application No. 05103690.3-2201, Reference EP34981TE900kap, dated Apr. 24, 2008.
EP Communication for Application No. 05103697.8-2201, Reference EP 34979TE900dfi, dated Jun. 17, 2008.
EP Communication for Application No. 03022573.4-1229, Reference EP28554-/df, dated Oct. 6, 2008.
EP Communication for Application No. 05103697.8-2201, Reference EP3497TE900dfi, dated Nov. 7, 2008.
EP Supplementary Search Report for Application No. 06839426, dated May 4, 2009.
EP Summons to attend oral proceedings for Application No. 05109295.5-2201 / 1650668, Reference EP36830RK900dfi, Mar. 8, 2012.
EP Decisions to refuse a European Patent for Application No. 05109295.5-2201, Reference EP36830RK900dfi, dated Aug. 7, 2012.
EP Provision of the minutes for Application No. 05109295.5-2201, Reference EP36830RK900dfi, Aug. 7, 2012.
Fegaras, "Optimizing Object Queries Using an Effective Calculus", ACM Transactions on Database Systems, vol. 25, No. 4, Dec. 2000.
Findler, "Contract Soundness for Object-Oriented Languages", Proceedings of the 2001 ACM SIGPLAN Conference on Object-Oriented Programming Systems, Languages and Applications, Oct. 14-18, 2001.
Foley, "Computer Graphics: Principles and Practices", Second Edition, Addison-Wesley Publishing Company, Chapter 5, pp. 201-227, 1990.
Fox, "Invention. The phantom car", NewScientist.com, Aug. 17, 2005.
Friis-Christensen, "Requirements and Research Issues in Geographic Data Modeling", Proceedings of the 9th ACM International Symposium on Advances in Geographic Information Systems, Nov. 9-10, 2001.
Fuh, "Implementation of SQL3 Structured Types with Inheritance and Value Substitutability", Proceedings of 25th International Conference on Very Large Data Bases (VLDB '99), Sep. 7-10, 1999.
Garret, Jr., "An Object-Oriented Environment for Representing Building Design and Construction Data", Advanced Construction Technology Center, Mar. 15, 1989.
Goscinski, "Distributed Operating Systems: The logical Design", Addison-Wesley Publishers Ltd., 1991.
Harrison, "Structure Editors User-Defined Type Values and Type Inference", International Conference on Software Methods and Tools (SMT 2000), Nov. 6-9, 2000.
Haverlock, "Object Serialization, Java, and C++", Dr. Dobb's Journal, Aug. 1, 1998.
Hay, "Data Model Patterns: Convention of Thought", Dorset House Publishing, Chapter 4 (pp. 46-67), and Chapter 12 (pp. 235-259), 1996.
Hernandez, "The Merge/Purge Problem for Large Databases", Proceedings of the 1995 ACM SIGMOD International Conference on Management of Data, May 22-25, 1995.
Hsiao, "DLFM: A Transactional Resource Manager", Proceedings of the 2000 ACM SIGMOD International Conference on Management of Data, May 16-18, 2000.
"Improved Recovery from Partial Page Writes of Data Pages", IBM Technical Disclosure Bulletin, vol. 36, No. 5, May 1993.
"Referential Integrity Implementation Details and Advantages", IBM Technical Disclosure Bulletin, vol. 38, No. 3, Mar. 1995.
JP Notice of Rejection for Application No. 2005-135274, dated Sep. 24, 2010.
JP Notice of Rejection for Application No. 2005-134492, dated Jan. 25, 2011.
JP Notice of Rejection for Application No. 2005-306948, dated Mar. 11, 2011.
JP Notice of Rejection for Application No. 2005-135274, dated Sep. 9, 2011.
JP Notice of Reasons for Rejection for Application No. 2008-545888, dated Apr. 19, 2012.
JP Notice of Reasons for Rejection for Application No. 2008-545888, dated Aug. 29, 2012.
Kaneko, "Design of 3D CG Data Model of "Move" Animation Database Systems", Advanced Database Research and Development Series, Proceedings of the Second Far-East Workshop on Future Database Systems, Apr. 26-28, 1992.
Kaneko, "Towards Dynamics Animation on Object-Oriented Animation Database System MOVE", Advanced Database Research and Development Series, Proceedings of the Third International Symposium on Database Systems for Advanced Applications, Apr. 6-8, 1993.
Katz, "Toward a Unified Framework for Version Modeling in Engineering Databases", ACM Computing Surveys, vol. 22, No. 4, Dec. 1990.
Kawabe, "Framework for 3D Modeling: Constraint-Based Description and Non-Manifold Geometric Modeling", Organization of Engineering Knowledge for Product Modelling in Computer Integrated Manufacturing, A Collection of Contributions Based on Lectures Presented at the 2nd Toyota Conference, Oct. 2-5, 1988.
Kampfer, "CAD Jumps on Windows 3.1 Bandwagon", Computer Aided Engineering, Nov. 1993.

(56) References Cited

OTHER PUBLICATIONS

Khan, "A Performance Evaluation of Storing XML Data in Relational Database Management Systems", Third International Workshop on Web Information and Data Management (WIDM 2001), Nov. 9, 2001.
Khoshafian, "Object Identity", Proceedings of the ACM Conference on Object-Oriented Programming Systems, Languages, and Applications (OOPSLA'86), Sep. 1986.
Kiesling, "ODBC in UNIX Environments", Dr. Dobb's Journal, Dec. 2002.
King, "TriStarp—An Investigation into the Implementation and Exploitation of Binary Relational Storage Structures", Proceedings of the 8th British National Conference on Data Bases (BNCOD-8), Jul. 9-11, 1990.
Krouse, "Geometric Models for CAD/CAM", Machine Design, Jul. 24, 1980.
Larsen, "Improve Programming Performance with Intel® Flash Memory Enhanced Factory Programming," Intel Corporation, printed May 9, 2006.
LeBlanc, "Design Data Storage and Extraction Using Objects", Concurrent Engineering: Research and Applications, Mar. 1993.
Leontiev, "On Type Systems for Object-Oriented Database Programming languages", ACM Computing Surveys, vol. 34, No. 4, Dec. 2002.
Levy, "International Recovery in Main Memory Database Systems", IEEE Transactions on Knowledge and Data Engineering, vol. 4, No. 6, Dec. 1992.
Lim, "Transaction Processing in Mobile Heterogeneous Database Systems", IEEE Transactions on Knowledge and Data Engineering, vol. 14, No. 6, Nov./Dec. 2002.
Mallet, "Myrtie: A set-oriented meta-interpreter driven by a "relational" trace for deductive databases debugging", Jan. 1999.
Manani, "Oggetto: An Object Oriented Database Layered on a Triple Store", The Computer Journal, vol. 35, No. 2, Apr. 1992.
McMahon, "SED—A Non-Interactive Text Editor", Bell laboratories, Jan. 10, 1979.
"Mechanical Design Software", Computer-Aided Engineering, Dec. 1993.
Melton, "SQL and Management of External Data", ACM SIGMOD Record, vol. 30, No. 1, Mar. 2001.
Mitchell, "The logic of Architecture", Massachusetts Institute of Technology, pp. 139-143, Apr. 26, 1990.
Motoszabu, "IEEE 1394: A Dream Interface at the Turning Point", PC User, Softbank Publishing Corporation, Oct. 24, 1999.
Navathe, "Evolution of Data Modeling for Databases", Communications of the ACM, vol. 35, No. 9, Sep. 1992.
Nelson, "Genetic Support for Caching and Disconnected Operation", 4th Workshop on Workstation Operating Systems (WWOS-IV), Oct. 14-15, 1993.
Nijssen, "Conceptual Schema and Relational Database Design: A Fact Oriented Approach", Prentice Hall, pp. 9-33, 42-43, 48-51, and 155-171, Jun. 1989.
"Oracle9t SQL Reference", Release 2 (9.2), Oct. 2002.
Orenstein, "Query Processing in the ObjectStore Database System", Proceedings of the 1992 ACM SIGMOD International Conference on Management of Data, Jun. 2-5, 1992.
Ottogalli, "Visualisation of Distributed Applications for Performance Debugging", International Conference on Computational Science (ICCS 2001), May 28-30, 2001.
Pachet, "A Combinational Approach to Content-based Music Selection", Proceedings of the IEEE International Conference on Multimedia Computing and Systems (ICMCS 1999), vol. 1, Jun. 7-11, 1999.
Papiani, "A Distributed Scientific Data Archive Using the Web, XML and SOL/MED", SIGMOD Record, vol. 28, No. 3, Sep. 1999.
PCT International Search Report and Written Opinion for Application No. PCT/US2006/048402, dated May 8, 2007.
Ponnekanti, "Online Index Rebuild", Proceedings of the 2000 ACM SIGMOD International Conference on Management of Data, May 16-18, 2000.
Powell, "Object, References, Indentifiers and Equality White Paper", SunSoft, OMG TC Document No. 93.7.5, Jul. 2, 1993.
Prosise, "2-D Drafting: Why Pay More?", PC Magazine, Feb. 23, 1993.
Ramsey, "An Analysis Approach to File Synchronization", Proceedings of the Joint 8th European Software Engineering Conference (ESEC), and the 9th ACM SIGSOFT Symposium on the Foundations of Software Engineering (FSE-9), Sep. 10-14, 2001.
Read III, "Developing the Next Generation Cockpit Display System", Proceedings of the IEEE 1996 National Aerospace and Electronics Conference (NAECON), May 20-23, 1996.
Reiner, "Benefits of X-based Three-Tier Client/Server Model with ESRI Applications", Virtual Solutions, 1995.
Rouse, "CAD Pioneers Are Still Trailblazing", Machine Design, vol. 59, No. 25, Oct. 22, 1987.
Roussopoulos, "Using Semantic Networking for Data Base Management", Proceedings of the First International Conference on Very Large Data Bases (VLDB'75), Sep. 22-24, 1975.
RU Official Action for Application No. 2003129662, dated Nov. 11, 2007.
"Optimization of CF Host Operation," SanDisk® Corporation, Feb. 28, 2005.
Santos, "Computer Aided Mechanical Engineering Design Environment for Concurrent Design Process", Proceedings of the 1993 ITEC Workshop on Concurrent Engineering, Simulation in Concurrent Engineering, May 4-6, 1993.
Seshadri, "Enhanced abstract data types in object-relational databases", The VLDB Journal, The International Journal on Very Large Databases, vol. 7, No. 3, Aug. 1998.
Simoes, "A RISC-Microcontroller Based Photovoltaic System for Illumination Applications", Fifteenth Annual IEEE Applied Power Electronics Conference and Exposition (APEC 2000), Feb. 6-10, 2000.
Simon, "Strategic Database Technology Management for the Year 2000", Morgan Kaufmann Publishers, Inc., pp. 3-33, 55-69, May 1995.
Singhal, "DDB—An Object Oriented Design Data Manager for VLSI CAD", Proceedings of the 1993 ACM SIGMOD International Conference on Management of Data, May 26-28, 1993.
"Optimizing Program/Erase Times", Spansion™, Sep. 2, 2004.
Sreekanth, "A Specification Environment for Configuring a Discrete-Part Manufacturing System Simulation Infrastructure", International Conference on Systems, Man and Cybernetics, Systems Engineering in the Service of Humans, Oct. 17-20, 1993.
Sreenath, "A hybrid computation environment for multibody simulation", Mathematics and Computers in Simulation, vol. 34, Issue 2, Aug. 1992.
Stevens, "Value in 3-D", Industry Week, Jan. 8, 1996.
Stonebraker, "The Case for Partial Indexes", SIGMOD Record, vol. 18, No. 4, Dec. 1989.
Strickland, "Intersection of Relational and Object", Proceedings of the AM/FM International Conference XVII, Mar. 14-17, 1994.
Sutherland, "The hybrid Object-Relational Architecture (HORA). An Integration of Object-Oriented and Relational Technology", Proceedings of the 1993 ACM/SIGAPP Symposium on Applied Computing, States of the Art and Practice, Feb. 14-16, 1993.
Suzuki, "Geometric Modeling Products", Proceedings of the Third International Conference on Engineering Graphics and Descriptive Geometry, vol. 2, Jul. 11-16, 1988.
Taylor, "An Integrated Robot System Architecture", Proceedings of the IEEE, vol. 71, No. 7, Jul. 1983.
TW Search Report for Application No. 094114140, dated Nov. 22, 2011.
Verlamis, "Bridging XML-Schema and relational databases, A system for generating and manipulating relational databases using valid XML documents", Proceedings of the 2001 ACM Symposium on Document Engineering, Nov. 9-10, 2001.
Watanabe, "Knowledge Integration for Architectural Design", Knowledge-Based Computer-Aided Architectural Design, Jul. 1994.
Waugh, "Specifying metadata standards for metadata tool configuration", Computer Networks and ISDN Systems, Proceedings of the Seventh International World Wide Web Conference, Apr. 14-18, 1998.

(56) References Cited

OTHER PUBLICATIONS

Wilcox, "Object Databases: Object methods in distributed computing", Dr. Dobbs Journal, Nov. 1994.
Wold, "Content-Based Classification, Search, and Retrieval of Audio", IEEE MultiMedia, vol. 3, Issue 3, Sep. 1996.
Yoshikawa, "XRel: A Path-Based Approach to Storage and Retrieval of XML Documents Using Relational Databases", ACM Transactions on Internet Technology, vol. 1, No. 1, Aug. 2001.
TW Search Report for Application No. 101110178, dated Aug. 28, 2014.
JP Examiner's Decision of Refusal for Application No. 2012-243915, dated Jan. 6, 2015.
TW Search Report for Application No. 098129955, dated Jan. 26, 2015.
TW Search Report for Application No. 098138300, dated Sep. 22, 2014.
EP Communication for Application No. 09 826 570.5-1953, Reference FB24586, dated Aug. 17, 2015.
CN Notice on the First Office Action for Application No. 200980136912.9, dated Jan. 14, 2013.
CN Notice on the First Office Action for Application No. 200980145878.1, dated Jan. 29, 2013.
EP Communication for Application No. 09813565.0-1229 / 2329360 PCT/US2009056419, Reference FB24240, dated Apr. 3, 2012.
EP Communication for Application No. 09826570.5-1229 / 2353081 PCT/US2009063127, Reference FB24586, dated May 29, 2012.
PCT International Search Report and Written Opinion for Application No. PCT/US2009/056419, dated Mar. 12, 2010.
PCT International Search Report and Written Opinion for Application No. PCT/US2009/063127, dated May 31, 2010.
Allchin, "Microsoft Explains Vista ReadyBoost." CDRinfo, Nov. 21, 2006.
Archer, "ReadyBoost Q&A", Jun. 2, 2006.
Archer, "ReadyBoost—Using Your USB Key to Speed Up Windows Vista", Apr. 14, 2006.
Bisson, "Hybrid Disk-Aware Spin-Down Algorithm with I/O Subsystem Support", Apr. 2007.
Darden, "Data Integrity: The Dell/EMC Distinction", May 2002.
Ekman, "TLB and Snoop Energy-Reduction Using Virtual Caches in Low-Power Chip-Multiprocessors", Aug. 12-14, 2002.
Greenan, "CompulsiveFS: Making NVRAM Suitable for Extremely Reliable Storage", Feb. 2007.
Iyigun, "Managing Cache Data and Metadata", U.S. Appl. No. 12/271,400, filed Nov. 14, 2008.
Iyigun, "Managing Cache Data and Metadata", U.S. Appl. No. 13/221,542, filed Aug. 30, 2011.
Iyigun, "Managing Cache Data and Metadata", U.S. Appl. No. 13/365,093, filed Feb. 2, 2012.
"Non-Volatile Memory Host Controller Interface (NVMHCI) 1.0", Apr. 14, 2008.
Ohn, "Path Conscious Caching of B-Tree Indexes in a Shared Disks Cluster", Journal of Parallel and Distributed Computing, Dec. 15, 2006.
Vitter, "External Memory Algorithms," Proceedings of the 6th Annual European Symposium on Algorithms, Aug. 24, 1998.
Zhu, "Power Awara Storage Cache Management", May 2005.
CN Notice on the Second Office Action for Application No. 200980136912.9, dated May 24, 2016.
CN Notice on the Third Office Action for Application No. 200980146878.1, dated May 6, 2016.
CN Decision on Reexamination for Application No. 200980145878.1, dated Apr. 1, 2016.
IN First Examination Report for Application No. 2682/DEL/2005, dated Oct. 20, 2014.
JP Final Notification of Reason(s) for Refusal for Application No. 2012-243915, dated Mar. 25, 2014.
CN Office Action for Application No. 200980145878.1, dated Apr. 4, 2014.
CA Office Action for Application No. 2,523,761, dated Feb. 26, 2014.
JP Notification of Reason(s) for Refusal for Application No. 2012-111004, dated Nov. 19, 2013.
JP Notice of Reasons for Rejection for Application No. 2011-526951, dated Dec. 16, 2013.
KR Final Notice of Preliminary Rejection for Application No. 10-2008-7014092, dated Nov. 28, 2013.
MY Adverse Report for Application No. PI 20081667, dated Aug. 30, 2013.
IN First Examination Report for Application No. 1086/DEL/2005, dated Sep. 10, 2013.
CN Notice on the Second Office Action for Application No. 200980145878.1, dated Sep. 16, 2013.
CN Notice on the Third Office Action for Application No. 200980137190.9, dated Aug. 1, 2013.
KR Reasons for Rejection for Application No. 10-2008-7014092, dated May 30, 2013.
CN Decision on Rejection for Application No. 200980136912.9, dated Aug. 1, 2013.
AU Examiner's first report on patent application No. 2005219500, Reference 12671530/DBW, dated May 31, 2010.
EP Communication for Application No. 05109295.5-2201, Reference EP36830RK900dfi, dated Jan. 28, 2008.
EP Communication for Application No. 05109295.5-2201, Reference EP36830RK900dfi, dated Oct. 28, 2008.
JP Final Rejection for Application No. 2005-306948, dated Jan. 13, 2012.
KR The Notice of Preliminary Rejection for .Application No. 10-2005-0099666, dated Apr. 30, 2012.
KR The Notice of Final Rejection for Application No. 10-2005-0099666, dated Nov. 26, 2012.
CA Examiner's Report for Application No. 2,523,761, dated Feb. 26, 2013.
IL Notification of Defects in Patent Application No. 191502, dated Feb. 17, 2013.
CN Notice on the Second Office Action for Application No. 200980137190.9, dated Mar. 20, 2013.
English Translation of Japanese Office Action for Japanese Patent Application No. 11-527865, mailed from the Japanese Patent Office dated Oct. 16, 2012.
JP Decision of Refusal for Application No. 2012-111004, dated Jul. 29, 2014.
Haining, "Non-Volatile Cache Management for Improving Write Response Time with Rotating Magnetic Media", Sep. 2000.
Supplementary European Search Report for EP 09814983.4, mailed from the European Patent Office dated Oct. 10, 2012.
PCT/US2009/055198, International Search Report and the Written Opinion of the International Searching Authority, dated Feb. 26, 2010, 11 pages.
Nieplocha et al., "ARMCI: A Portable Aggregate Remote Memory Copy Interface", retrieved at <<http://www.emsl.pnl.gov/docs/parsoft/armci/publications/armci1-1.pdf»,Version 1.1, Oct. 30, 2000, pp. 1-11.
Brian S. Mitchell, "Managing Cache Coherence in Multiprocessor Computer Systems", retrieved at <<http://www.cs.drexel.edu/-bmitchel/research/CacheCoherence/CacheCoherence.html», Jul. 10, 2008, pp. 1-26.
Dove et al., "Windows XP for Embedded Applications", retrieved at <<http://www.automation.com/resources-tools/articles-white-papers/pc-based-control/windows-xp-for-embedded-applications», Jul. 10, 2008, pp. 1-3.
"Novell", retrieved at «www.novell.com/documentation/nw6p/index.html?page=/documentation/nw6p/nss_enu/data/h5grftdf.html», Jul. 10, 2008, pp. 1-7.
Budiu, "A Duel-Disk File System: ext4", Apr. 16, 1997.
iSCSI, "Performance evaluations of iSCSI implementation". Jan. 10, 2008.
Matthews, "Improving File System Performance with Adaptive Methods", Fall 1999.
Rosenblum, "The Design and Implementation of a Log-Structured File System", Proceedings of the thirteenth ACM symposium on Operating systems principles, Jul. 24, 1991.
JP Notice of Rejection for Application No. 2012-243915, dated Jul. 9, 2013.

(56) References Cited

OTHER PUBLICATIONS

CA Office Action for Application No. 2,723,077, dated Jan. 9, 2013.
JP Notice of Rejection for Application No. 2012-111004, dated May 14, 2013.
"Notice of Allowance Issued in Russian Patent Application No. 2008140263", dated Nov. 22, 2012, 20 Pages.
"Notice of Allowance Issued in Japanese Patent Application No. 2008-545888", dated Mar. 26, 2013, 4 Pages.
"Decision on Reexamination Issued in Chinese Patent Application No. 200980136912.9", dated Feb. 15, 2016, 22 Pages.
"Third Office Action Issued in Chinese Patent Application No. 200980136912.9", dated Sep. 9, 2016, 8 Pages.
"Notice of Allowance Issued in Chinese Patent Application No. 200980137190.9", dated Oct. 23, 2013, 6 Pages.
"Notice of Allowance Issued in Chinese Patent Application No. 200980145878.1", dated Aug. 19, 2016, 4 Pages.
"Office Action Issued in Chinese Patent Application No. 200980145878.1", dated May 6, 2016, 7 Pages.
"Notice of Allowance Issued in Australian Patent Application No. 2010201717", dated Oct. 18, 2011, 3 Pages.
"Notice of Allowance Issued in Japanese Patent Application No. 2011-526951", dated Feb. 12, 2015, 4 Pages.
"Notice of Allowance Issued in Japanese Patent Application No. 2011-527865", dated May 21, 2013, 4 Pages.
"Office Action Issued in Brazilian Patent Application No. PI0304297-9", dated Sep. 29, 2015, 6 Pages. (W/O English Translation).
"Notice of Allowance Issued in Taiwan Patent Application No. 94114140", dated Apr. 23, 2012, 4 Pages.
"Developer's Guide to Apple Data Detectors—For Version 1.0.2", Alle Preliminary Technical Publications, Dec. 1, 1997, 34 Pages.
Fortin, et al., "External Memory Devices (EMD)", Microsoft Confidential, Jun. 17, 2004, 12 Pages.
"Notice of Allowance Issued in Mexican Patent Application No. PA/a/2005/011244", dated Oct. 30, 2009, 1 Page. (W/o English Translation).
U.S. Appl. No. 12/234,411, filed Sep. 19, 2008, Shi Cong.
U.S. Appl. No. 13/087,927, filed Apr. 15, 2011, Shi Cong.
U.S. Appl. No. 12/121,776, filed May 15, 2008, William J. Bolosky.
U.S. Appl. No. 60/416,115, filed Oct. 4, 2002, Stuart Sechrest.
U.S. Appl. No. 10/325,591, filed Dec. 20, 2002, Stuart Sechrest.
U.S. Appl. No. 11/150,686, filed Jun. 9, 2005, Stuart Sechrest.
U.S. Appl. No. 11/150,728, filed Jun. 9, 2005, Stuart Sechrest.
U.S. Appl. No. 12/759,526, filed Apr. 13, 2010, Stuart Sechrest.
U.S. Appl. No. 12/759,536, filed Apr. 13, 2010, Stuart Sechrest.
U.S. Appl. No. 10/837,986, filed May 3, 2004, Cenk Ergan.
U.S. Appl. No. 12/627,710, filed Nov. 30, 2009, Cenk Ergan.
U.S. Appl. No. 13/231,088, filed Sep. 13, 2011, Cenk Ergan.
U.S. Appl. No. 13/555,803, filed Jul. 23, 2012, Cenk Ergan.
U.S. Appl. No. 10/970,772, filed Oct. 21, 2004, Alexander Kirshenbaum.
U.S. Appl. No. 12/366,112, filed Feb. 5, 2009, Alexander Kirshenbaum.
U.S. Appl. No. 12/775,168, filed May 6, 2010, Alexander Kirshenbaum.
U.S. Appl. No. 13/187,757, filed Jul. 21, 2011, Alexander Kirshenbaum.
U.S. Appl. No. 11/303,382, filed Dec. 16, 2005, Michael R. Fortin.
U.S. Appl. No. 14/058,078, filed Oct. 18, 2013, Michael R. Fortin.
U.S. Appl. No. 11/953,312, filed Dec. 10, 2007, Michel Fortin.
U.S. Appl. No. 14/076,576, filed Nov. 11, 2013, Michael Fortin.
U.S. Appl. No. 61/097,079, filed Sep. 15, 2008, Mehmet Iyigun.
U.S. Appl. No. 12/271,472, filed Nov. 14, 2008, Mehmet Iyigun.
U.S. Appl. No. 12/271,400, filed Nov. 14, 2008, Mehmet Iyigun.
U.S. Appl. No. 13/221,542, filed Aug. 30, 2011, Mehmet Iyigun.
U.S. Appl. No. 13/365,093, filed Feb. 2, 2012, Mehmet Iyigun.
JP Notice of Reason for Rejection for Application No. 2011-526951, dated Jul. 11, 2014.
JP Notice of Rejection for Application No. 2003-347507, dated Mar. 26, 2010.
JP Notice of Rejection for Application No. 2003-347507, dated Nov. 30, 2010.
CA Office Action for Application No. 2,442,188, dated Mar. 10, 2010.
AU Examiner's first report on patent application No. 2003243990, dated Jan. 23, 2009.
KR Notice of Preliminary Rejection for Application No. 10-2003-69015, dated Nov. 30, 2009.
MX Office Action for Application No. PA/a/2003/008766, dated Jul. 28, 2007.
EP Communication for Application No. 03 022 573.4-1229, Reference EP28554-/df, dated Jul. 14, 2010.
AU Examiner's first report on patent application No. 2010201717, dated Jun. 28, 2011.
EP Result of consultation for Application No. 05 109 295.5-2201, Reference EP36830RK900dfi, Jun. 12, 2012.
EP Result of consultation for Application No. 05 109 295.5-2201, Reference EP36830RK900dfi, Jun. 15, 2012.
EP Communication for Application No. 06 839 426.1-1229, Reference FB20211, dated Sep. 2, 2011.
EP Communication for Application No. 06 839 426.1-1229, Reference FB20211, dated Oct. 28, 2011.
PCT International Search Report and Written Opinion for Application No. PCT/US06/26373, dated May 11, 2007.
JP Decision to Decline the Amendment for Application No. 2005-135274, dated Jul. 3, 2012.
JP Final Rejection for Application No. 2005-135274, dated Jul. 3, 2012.
"Memory Accelerator", Retrieved from <<http://www.newscientist.com/article.ns?id=dn7857&feedId=online-news_rss20>>, Aug. 17, 2005, 3 Pages.
"Orade 9i SQL Reference—SQL Statements: Create Cluster to Create Java, 10 of 12", Retrieved from <<https://docs.oracle.com/cd/B10501_01/server.920/a96540/statements_510a.htm>>, Oct. 2002, 29 Pages.
"Notice of Allowance Issued in European Patent Application No. 03022573.4", dated May 2, 2011, 4 Pages.
"Summons to Attend Oral Proceedings Issued in European Patent Application No. 05103697.8", Dec. 17, 2015, 5 Pages.
"Office Action Issued in European Patent Application No. 05109295.5", dated Dec. 16, 2009, 3 Pages.
"Notice of Allowance Issued in European Patent Application No. 06839426.1", dated Jul. 16, 2012, 5 Pages.
"Non Final Office Action Issued in U.S. Appl. No. 10/186,164", dated Jun. 7, 2005, 6 Pages.
"Notice of Allowance Issued in U.S. Appl. No. 10/186,164", dated Sep. 28, 2005, 3 Pages.
"Notice of Allowance Issued in U.S. Appl. No. 10/186,164", dated Oct. 4, 2005, 3 Pages.
"Non Final Office Action Issued in U.S. Appl. No. 10/304,367", dated Sep. 9, 2005, 13 Pages.
"Notice of Allowance Issued in U.S. Appl. No. 10/304,367", dated Dec. 20, 2005, 3 Pages.
"Notice of Allowance Issued in U.S. Appl. No. 10/304,367", dated Nov. 2, 2005, 2 Pages.
"Non Final Office Action Issued in U.S. Appl. No. 10/372,734", dated Sep. 1, 2005, 9 Pages.
"Notice of Allowance Issued in U.S. Appl. No. 10/372,734", dated Mar. 14, 2006, 7 Pages.
"Notice of Allowance Issue in Taiwan Patent Application No. 101110178", dated Dec. 10, 2014, 4 Pages.
"Office Action and Search report Issued in Taiwan Patent Application No. 101110178", dated Sep. 3, 2014, 26 Pages.
"Notice of Allowance Issued in Korean Patent Application No. 10-2003-0069015", dated Jun. 30, 2010, 2 Pages. (W/o English Translation).
"Notice of Allowance Issued in Korean Patent Application No. 10-2005-0037139", dated May 31, 2011, 3 Pages. (W/o English Translation).
"Notice of Allowance Issued in Korean Patent Application No. 10-2005-99666", dated Feb. 22, 2013, 2 Pages. (W/o English Translation).
"Notice of Allowance Issued in Korean Patent Application No. 10-2008-7014092", dated Apr. 25, 2014, 2 Pages. (W/o English Translation).
"Final Office Action Issued in U.S. Appl. No. 13/343,985", dated Aug. 20, 2015, 16 Pages.

(56) References Cited

OTHER PUBLICATIONS

"Non Final Office Action Issued in U.S. Appl. No. 13/343,985", dated Sep. 17, 2012, 6 Pages.
"Non Final Office Action Issued in U.S. Appl. No. 13/343,985", dated Feb. 26, 2015, 15 Pages.
"Notice of Allowance Issued in U.S. Appl. No. 13/343,985", dated Jan. 23, 2013, 5 Pages.
"Notice of Allowance Issued in U.S. Appl. No. 13/343,985", dated Jun. 19, 2013, 9 Pages.
"Notice of Allowance Issued in U.S. Appl. No. 13/343,985", dated Aug. 21, 2013, 9 Pages.
"Notice of Allowance Issued in U.S. Appl. No. 13/343,985", dated Dec. 31, 2013, 8 Pages.
"Notice of Allowance Issued in U.S. Appl. No. 13/343,985", dated Jul. 8, 2014, 10 Pages.
"Notice of Allowance Issued in U.S. Appl. No. 13/343,985", dated Jun. 14, 2016, 16 Pages.
"Notice of Allowance Issued in U.S. Appl. No. 13/343,985", dated Aug. 4, 2016, 3 Pages.
"Notice of Allowance Issued in Chinese Patent Application No. 200680047384.6", dated Sep. 23, 2011, 4 Pages.
"Non Final Office Action Issued in U.S. Appl. No. 15/080,357", dated Oct. 5, 2016, 11 Pages.
"Notice of Allowance Issued in Canadian Patent Application No. 2,442,188", dated Feb. 22, 2011, 1 Page.
"Notice of Allowance Issued in Canadian Patent Application No. 2,523,761", dated Jan. 6, 2015, 1 Page.
"Notice of Allowance Issued in Canadian Patent Application No. 2,723,077", dated Feb. 17, 2014, 2 Pages.
"Notice of Allowance Issued in Russian Patent Application No. 2003129662", dated Aug. 4, 2008, 19 Pages.
"Notice of Allowance Issued in Australian Patent Application No. 2003243990", dated Feb. 1, 2010, 3 Pages.
"Notice of Allowance Issued in Japanese Patent Application No. 2003-347507", dated Apr. 1, 2011, 6 Pages.
"Notice of Allowance Issued in Chinese Patent Application No. 200510083792.4", dated Nov. 21, 2008, 4 Pages.
"Notice of Allowance Issued in Russian Patent Application No. 2005132448", dated Jan. 20, 2010, 19 Pages.
"Office Action Issued in Japanese Patent Application No. 2005-134492", dated Jan. 25, 2011, 8 Pages.
"Office Action Issued in Australian Patent Application No. 2006331830", dated Feb. 1, 2011, 2 Pages.
"Notice of Allowance Issued in Australian Patent Application No. 2005219500", dated Oct. 14, 2010, 3 Pages.
"Notice of Allowance Issued in Japanese Patent Application No. 2005-306948", dated Aug. 7, 2012, 6 Pages.
"Notice of Allowance Issued in Australian Patent Application No. 2006331830", dated May 19, 2011, 3 Pages.
"Office Action Issued in Australian Patent Application No. 2006331830", dated Nov. 29, 2010, 2 Pages.
Tripp, Kimberly L., "Forewarned is Forearmed! Critical Management for Database Engineer", In SQL Server Magazine, vol. 12, Dec. 15, 2003, pp. 30-37.
"International Search Report and Written Opinion Issued in PCT Application No. PCT/US06/48402", dated May 8, 2007, 8 Pages.
"Final Office Action Issued in U.S. Appl. No. 15/340,826", dated Jun. 21, 2019, 10 Pages.
"Novell Storage Services Administration Guide", Retrieved From: https://www.novell.com/documentation/nw6p/pdfdoc/nss_enu/nss_enu.pdf, Feb. 2002, 72 Pages.
"Office Action Issued in Mexican Patent Application No. MX/a/2008/007585", dated Jun. 24, 2011, 3 Pages.
PI0304297-9, "Office Action Issued in Brazilian Patent Application No. PI0304297-9", dated Apr. 18, 2016, 5 Pages.

* cited by examiner

US 10,509,730 B2

AGGREGATION OF WRITE TRAFFIC TO A DATA STORE

RELATED APPLICATIONS

This application is a Continuation of, and claims benefit from, U.S. patent application Ser. No. 13/343,985 that was filed on Jan. 5, 2012, and that is Continuation of U.S. patent application Ser. No. 13/087,927, (U.S. Pat. No. 8,108,450) that was filed on Apr. 15, 2011 (Issued Jan. 31, 2012), and that is a Continuation of U.S. patent application Ser. No. 12/234,411, (U.S. Pat. No. 7,953,774) that was filed on Sep. 19, 2008 (Issued May 31, 2011), each of which is incorporated herein by reference in its entirety.

BACKGROUND

Data stores, such as, for example, disk drives and flash-based storage, are most efficient when writing data sequentially and are very inefficient when writing randomly scattered data. In addition, disk drives are most efficient when reading sequential data and are very inefficient when reading randomly scattered data. A typical modern disk drive is capable of moving approximately 700 kilobytes (KB) of data in an amount of time taken for the disk drive to seek an arbitrary location on a disk. As technology advances, disk drives may be capable of moving larger amounts of data during a same time period.

Most data transfers are much smaller than 700 KB. As a result, disk drives may spend a significant amount of time seeking locations on disks during non-idle time periods.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

A processing device and a machine-implemented method may be provided for sequentially aggregating data, originally intended to be written to a volume of a random access medium, to a write log. The processing device may determine whether the data is suitable for writing to the write log. If the data is determined to be suitable for writing to the write log, then the processing device may sequentially aggregate, or write, the data to the write log. Otherwise, the data may be written to an originally intended destination. Entries of the write log may be drained to originally intended destinations upon an occurrence of at least one of a number of conditions. The conditions may include, but not be limited to: the write log being in a state in which new log entries are not permitted; an absence of input or output activity with respect to the random access medium upon which the write log resides; the write log being at the least a first predetermined amount full; the write log being at least a second predetermined amount full regardless of the input or output activity of the random access medium; and a remapping tree being larger than a predetermined size. The remapping tree may map an address range of a random access medium to one or more entries of the write log.

In some embodiments, respective checkpoints may be written to the write log at time intervals. Each of the respective checkpoints may include information describing contents of the write log, such that the remapping tree may be rebuilt after a dirty shutdown. The information included in the respective checkpoints may be obtained from nodes of the remapping tree.

DRAWINGS

In order to describe the manner in which the above-recited and other advantages and features can be obtained, a more particular description is described below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Figure 1:
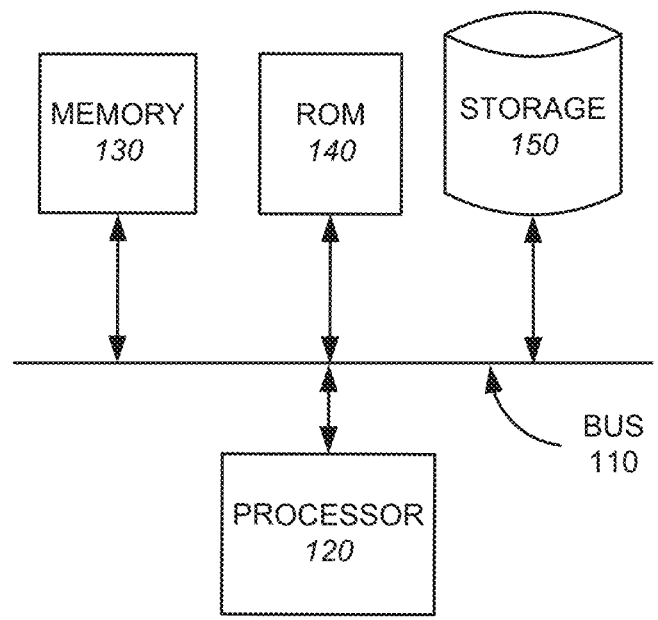
FIG. 1 illustrates a functional block diagram of an exemplary processing device, which may be used to implement embodiments consistent with the subject matter of this disclosure.

Embodiments are discussed in detail below. While specific implementations are discussed, it is to be understood that this is done for illustration purposes only. A person skilled in the relevant art will recognize that other components and configurations may be used without parting from the spirit and scope of the subject matter of this disclosure.

Overview

A method and a system are provided for receiving a request to write to a random access medium, such as, for example, a disk, flash-based storage, or other random access medium. The request to write may then be analyzed to determine whether the request is suitable for sequentially aggregating to a write log. The request may be determined to be suitable for sequentially aggregating to the write log when the request is for writing less than a predetermined amount of data to the random access medium. In some embodiments a request for writing, to the random access medium, an adjustable threshold amount of data, which may be less than 700 KB, may be determined to be suitable for sequentially aggregating to the write log.

The write log may reside within a same volume of the random access medium as an originally intended destination, a different volume of the random access medium as the originally intended destination, or a different volume of a different random access medium as the originally intended destination. The write log may include a number of entries, each having metadata describing a respective entry and corresponding payload data. When a request to write data to the random access medium is determined to be suitable for writing to the write log, the data may be added to an end of the write log. A remapping tree may map locations of the random access medium, outside of the write log, to corresponding entries of the write log and vice versa.

Draining is a process by which entries in the write log are moved to intended destinations of the volume of the random access medium. The write log may be drained to the intended locations of the random access medium under a number of conditions. For example, in some embodiments, the conditions may include: the write log being in a state in which new entries to the write log are not permitted; the write log being more than a first predetermined amount full; no input/output activity with respect to the random access medium and the write log being more than a second predetermined amount full, where the second predetermined amount is less than the first predetermined amount; and the remapping tree being larger than a third predetermined size. During draining, adjacent writes may be merged into a single drain write and drain writes may be ordered to minimize seek time.

In some embodiments, a checkpoint may be written to the write log at adjustable time intervals. A checkpoint may include information summarizing contents of the write log. A dirty shutdown may be an unexpected shutdown or system failure. After a dirty shutdown or a normal shutdown of a system, information included in a last checkpoint written to the write log may be used to recover from the dirty shutdown or the normal shutdown by rebuilding a remapping tree.

Exemplary Processing Device

FIG. 1 is a functional block diagram of an exemplary processing device 100, which may be used to implement embodiments consistent with the subject matter of this disclosure. Processing device 100 may be a desktop personal computer (PC), a notebook or laptop PC, a server, or other processing device. Processing device 100 may include a bus 110, a memory 130, a read only memory (ROM) 140, a processor 120, and a storage device 150. Bus 110 may permit communication among components of processing device 100.

Processor 120 may include at least one conventional processor or microprocessor that interprets and executes instructions. Memory 130 may be a random access memory (RAM) or another type of dynamic storage device that stores information and instructions for execution by processor 120. Memory 130 may store temporary variables or other intermediate information used during execution of instructions by processor 120. ROM 140 may include a conventional ROM device or another type of static storage device that stores static information and instructions for processor 120. Storage device 150 may include a hard disk and corresponding drive, a flash-based storage device, or other type of random access data storage device or medium for storing data and/or instructions for processor 120.

Processing device 100 may perform functions in response to processor 120 executing sequences of instructions contained in a tangible machine-readable medium, such as, for example, memory 130, ROM 140, storage device 150 or other medium. Such instructions may be read into memory 130 from another machine-readable medium or from a separate device via a communication interface (not shown).

Write Log

Figure 2:
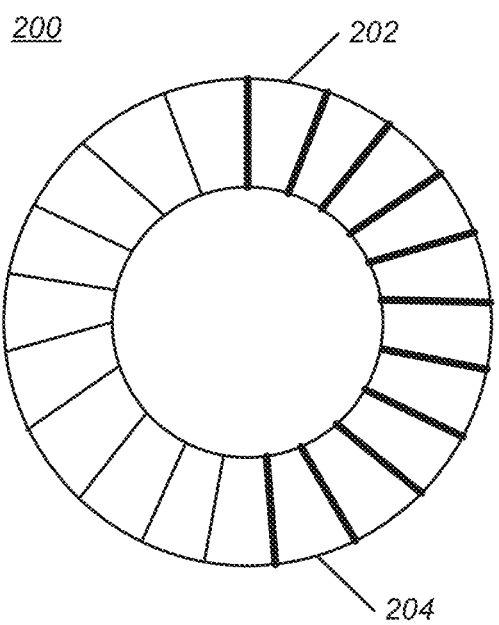
FIG. 2 illustrates exemplary circular storage for storing a write log in embodiments consistent with the subject matter of this disclosure.

In embodiments consistent with the subject matter of this disclosure, a write log, for sequentially aggregating writes intended for a random access medium, may be a circular storage area within a random access medium, such as, for example, a disk or other random access medium. FIG. 2 illustrates an exemplary write log 200. Write log 200 may include multiple entries, including a starting entry 202 and an ending entry 204. Starting entry 202 may be an oldest entry of write log 200, while ending entry 204 may be a newest entry of write log 200. That is, new entries may be appended to write log 200 after ending entry 204, and ending entry 204 may be updated to correspond to a newest of the appended entries.

Figure 3:
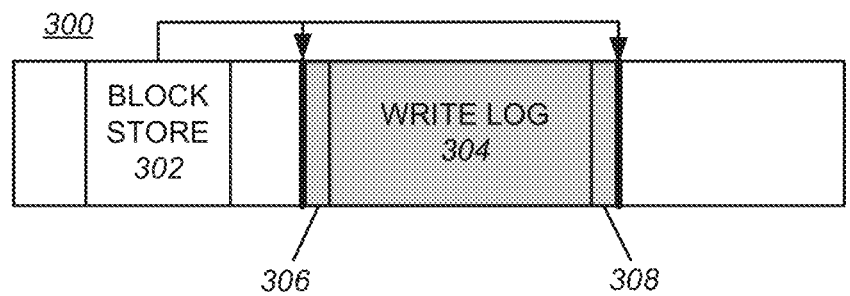
FIG. 3 illustrates an exemplary write log in a volume of a random-access medium.

FIG. 3 illustrates exemplary structures which may be stored on a random access medium 300 consistent with the subject matter of this disclosure. Random access medium 300 may include a block store structure 302 and a write log 304 recorded on random access medium 300. Block store structure 302 may include information with respect to an area of random access medium 300 which is not to be used by the file system. The area may correspond to an area reserved for write log 304 for sequentially aggregating data intended for a volume of random access medium 300. In some embodiments, write log 304 may be included within a different volume of random access medium 300 than an originally intended destination, or a different volume of a different random access medium.

Write log 304 may include a first control area 306 and a second control area 308, which may be located at a beginning and an end, respectively, of write log 304. The first and the second control area may include information about write log 304 including, but not limited to, information about a starting entry of write log 304 and information about a physical end of write log 304. In some embodiments, the information about a starting entry may include a starting log sequence number (LSN) of write log 304, and the information about a physical end of write log 304 may include a wrapping LSN. Some embodiments may include information, such as a pointer or other information regarding a location of a last checkpoint within the first control area 306 and the second control area 308.

Each entry of write log 304 corresponds to a LSN. A LSN may include a wrap count portion and an offset portion. The wrap count portion may be a number of occurrences of wrapping back to a physical beginning of write log 304. The offset portion may be an offset in sectors or some other unit of measurement, from a physical beginning of write log 304. A wrapping LSN may be a LSN at which wrapping to a physical beginning of write log 304 and incrementing of the wrap count may occur. For example, if the wrapping LSN is <wrap count>·400, where 400 is an offset from a physical beginning of write log 304, then when a current LSN has reached, for example, 2.400, then wrapping to a physical beginning of write log 304 may occur and the current LSN may become 3.0.

Figure 4:
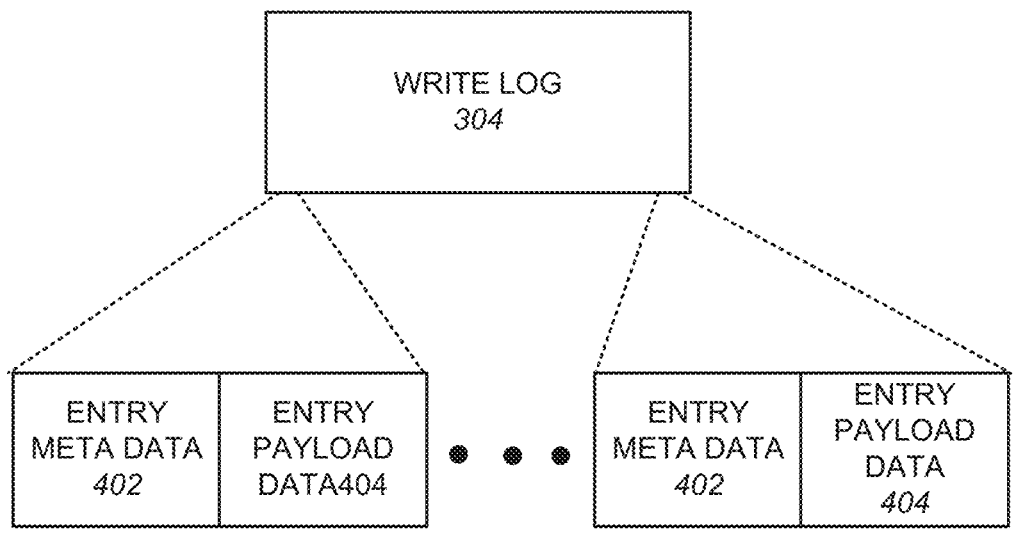
FIG. 4 illustrates a more detailed view of the exemplary write log shown in FIG. 3.

Write log 304 may include a number of entries. As shown in FIG. 4, each of the entries may include entry metadata 402 and entry payload data 404. Entry metadata 402 may include information about a respective entry. For example, entry metadata 402 may include information about a size of the respective entry, and a logical block address (LBA) of an intended destination in a volume of random access medium 300, as well as different or other information. Further, entry metadata 402 may include a checksum or other data indicating whether the respective entry is valid. In some embodiments, entry metadata 402 and entry payload data 404 may be sector aligned.

A remapping tree may be maintained in dynamic storage, such as, for example, memory or RAM. The remapping tree may map intended destinations, such as, for example, LBAs in a volume of a random access medium, to entries in a write log and vice versa. The remapping tree may be structured as an AVL tree. An AVL tree is a self-balancing binary search tree in which heights of child subtrees of any node may differ by no more than one.

Figure 5:
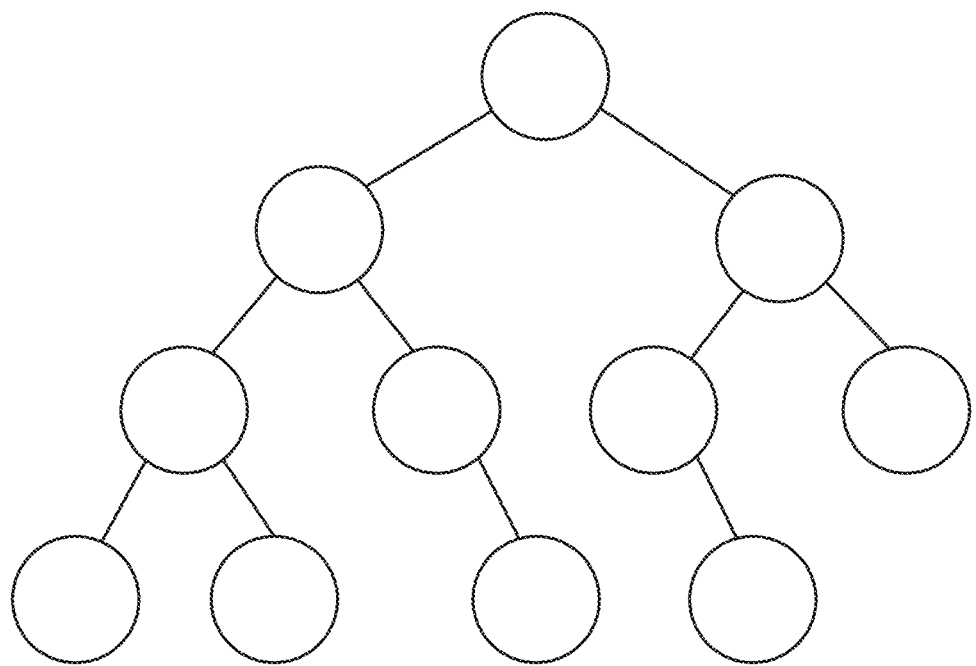
FIG. 5 illustrates and exemplary structure of a remapping tree consistent with the subject matter of this disclosure.

FIG. 5 illustrates an exemplary remapping tree. As one can see in the exemplary remapping tree, heights of all child subtrees differ by no more than one from other child subtrees beginning on a same level. Of course, in other embodiments, a remapping tree may be a different data structure. Each node of the remapping tree may include information, such as, for example, a LBA of an intended destination, a corresponding LSN in a write log, information describing a type of entry, as well as other or different information.

If a LBA of a random access medium is written to twice, the second write invalidates the first write. Similarly, if the first write to the LBA is redirected to a write log and the second write to the LBA is also redirected to the write log, an entry in the write log corresponding to the first write may be superseded by an entry in the write log corresponding to the second write. This may be referred to as an internal overwrite.

However, if the first write is redirected to the write log while the second write is written directly to the LBA in the volume of the random access medium, the entry of the write log corresponding to the first write is no longer valid. An invalidation record may be appended to the write log indicating that the entry corresponding to the first write is no longer valid.

Figure 6:
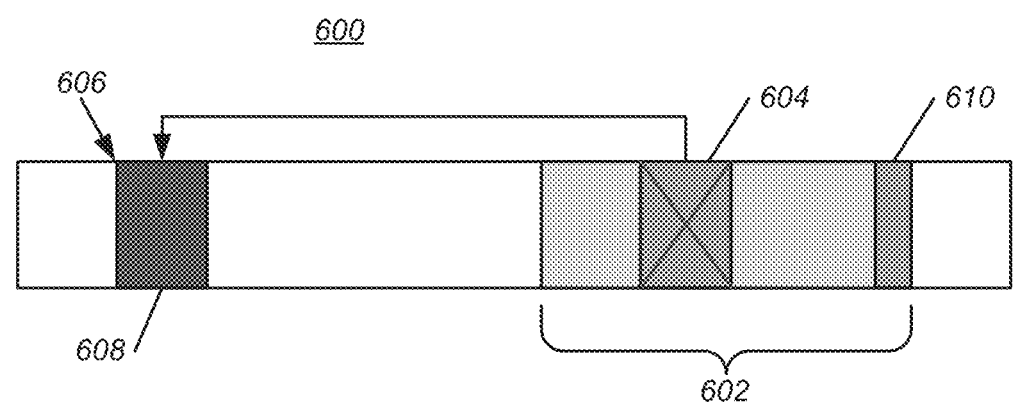
FIG. 6 illustrates an effect of overwriting data stored on a ransom access medium, which is mapped to an entry of a write log.

FIG. 6 illustrates a volume 600 of a random access medium. Write log 602 may be included in volume 600. A first write may be redirected to write log 602 and recorded as entry 604 of write log 602. The first write may have an intended destination corresponding to destination 608 in volume 600. A second write 606 may be written directly to destination 608. Thus, entry 604 may now be invalid. Invalidation record 610 may be appended to write log 602 to indicate that entry 604 is now invalid. Later, when the entries of write log 602 are to be drained to respective intended destinations in volume 600, entry 604 may not be drained to destination 608 because doing so would overwrite destination 608 and destroy contents of destination 608. Instead, entry 604 may simply be discarded.

Exemplary Processing

Figure 7:
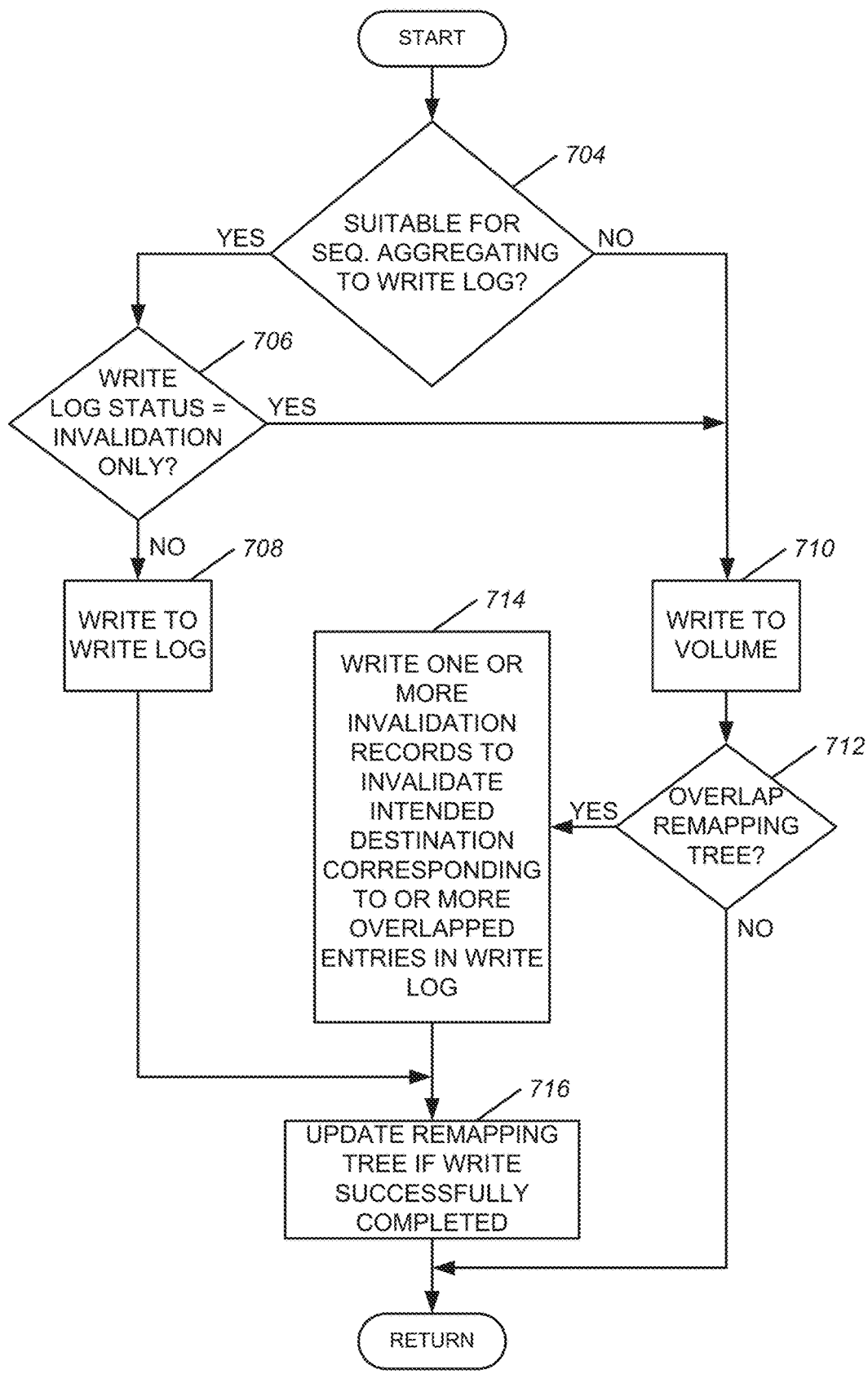
FIGS. 7 and 8 are flowcharts illustrating exemplary processes for processing a received write request for writing to a random access medium, a write completed indication with respect to writing to the write log.

FIG. 7 is a flowchart illustrating an exemplary process for determining whether a received write request is suitable for sequentially aggregating to a write log, and, if so, redirecting the write request to the write log. The process may begin with a processing device determining whether the received write request is suitable for sequentially aggregating to the write log (act 704).

Figure 8:
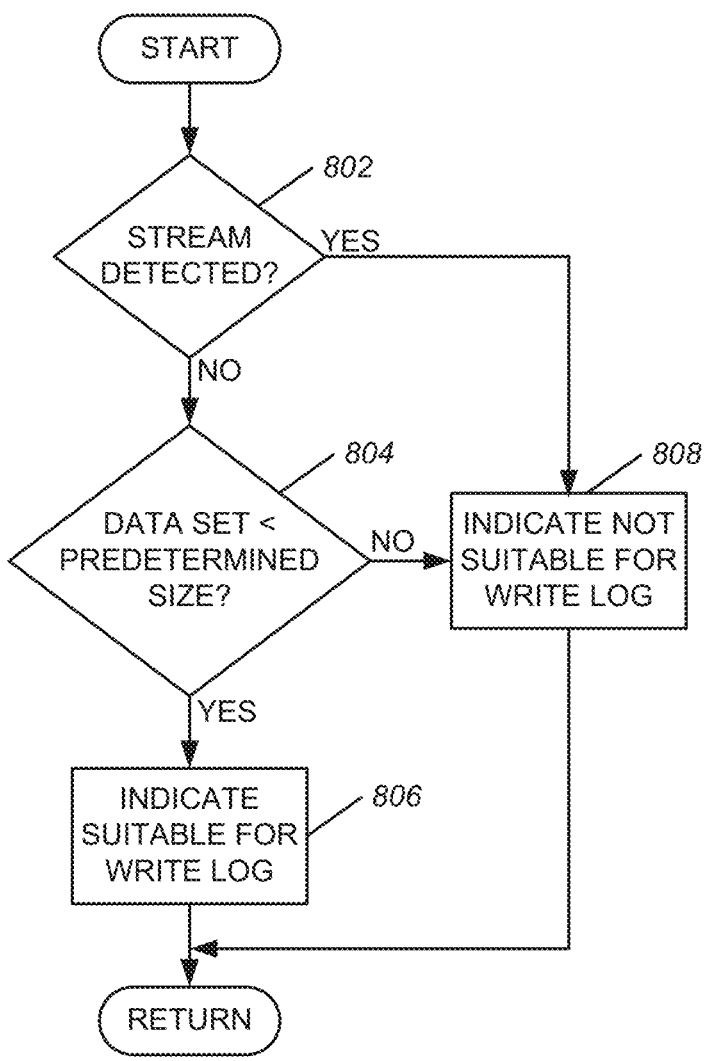

FIG. 8 is a flowchart illustrating an exemplary process for performing act 704 of FIG. 7. The process may begin with the processing device determining whether the received write request is for a stream (act 802; FIG. 8). The processing device may detect a stream by monitoring volume offsets of read and write requests to determine whether read and write patterns are sequential. If the read and write patterns are determined to be sequential, the processing device has detected a stream and may not direct the stream to the write log. If a stream is detected, the processing device may indicate that the received write request is not suitable for redirecting to the write log (act 808) and the process may be completed.

If, during act 802, the processing device determines that the received write request is not for a stream, then the processing device may determine whether data, or a data set, to be written, is less than a predetermined size, such as, 700 KB, or another size (act 804). If the data, or the data set, is not less than the predetermined size, then the processing device may indicate that the write request is not suitable for redirecting to the write log (act 808) and the process may be completed.

If, during act 804, the processing device determines that the data, or the data set, to be written, is less than the predetermined size, then the processing device may indicate that the write request is suitable for redirecting to the write log (act 806). The process may then be completed.

Returning to FIG. 7, if during act 704 the processing device determines that the write request is suitable for sequentially aggregating to the write log, then the processing device may determine whether a status of the write log is invalidation only, indicating that only invalidation records may be written to the write log (act 706). If the status of the write log is not invalidation only, then the processing device may write the data, or the data set, as an entry to the write log (act 708.

If, the write to the write log completes successfully the processing device may update a remapping tree for mapping intended destinations in a volume of a random access medium to entries in the write log (act 716).

If, during act 704, the processing device determines that the data, or the data set, to be written, is not suitable for sequentially aggregating to the write log, then the data, or the data set, may be written to an intended destination in the volume of the random access medium (act 710). The processing device may then determine whether any of the LBAs of the intended destination correspond to one or more entries of the write log by referencing the remapping tree (act 712). If any of the LBAs of the intended destination corresponds to one or more entries of the write log, then one or more invalidation records may be appended to the write log to indicate invalidation of the intended destination corresponding to the one or more entries of the write log (act 714).

Figure 9:
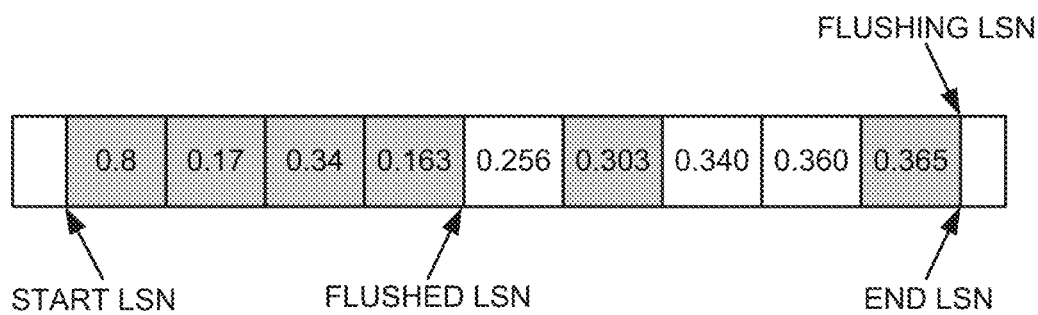
FIG. 9 illustrates exemplary entries in a write log and flushing of the entries.

Writes to the write log may be completed out of order. For example, FIG. 9 shows entries of a write log and a respective LSN for each of the entries. A shaded entry corresponds to an entry not having a pending write (i.e., a respective write to the write log for the entry has been completed). An unshaded entry corresponds to an entry having a pending write. Thus, according to FIG. 9, the entry indicated by LSN 0.256 has a write pending.

A flushed LSN is a LSN corresponding to an entry of the write log, such that all entries of the write log preceding the corresponding entry have no pending writes. Start LSN is a LSN corresponding to a first entry of the write log to be considered for draining, or to be included in a checkpoint. Draining of the write log and creation of checkpoints, both of which are discussed below, may not consider entries beyond the flushed LSN. A flushing LSN is an LSN corresponding to a target entry for flushing. An end LSN is an LSN corresponding to a logical end of the write log.

Figure 10:
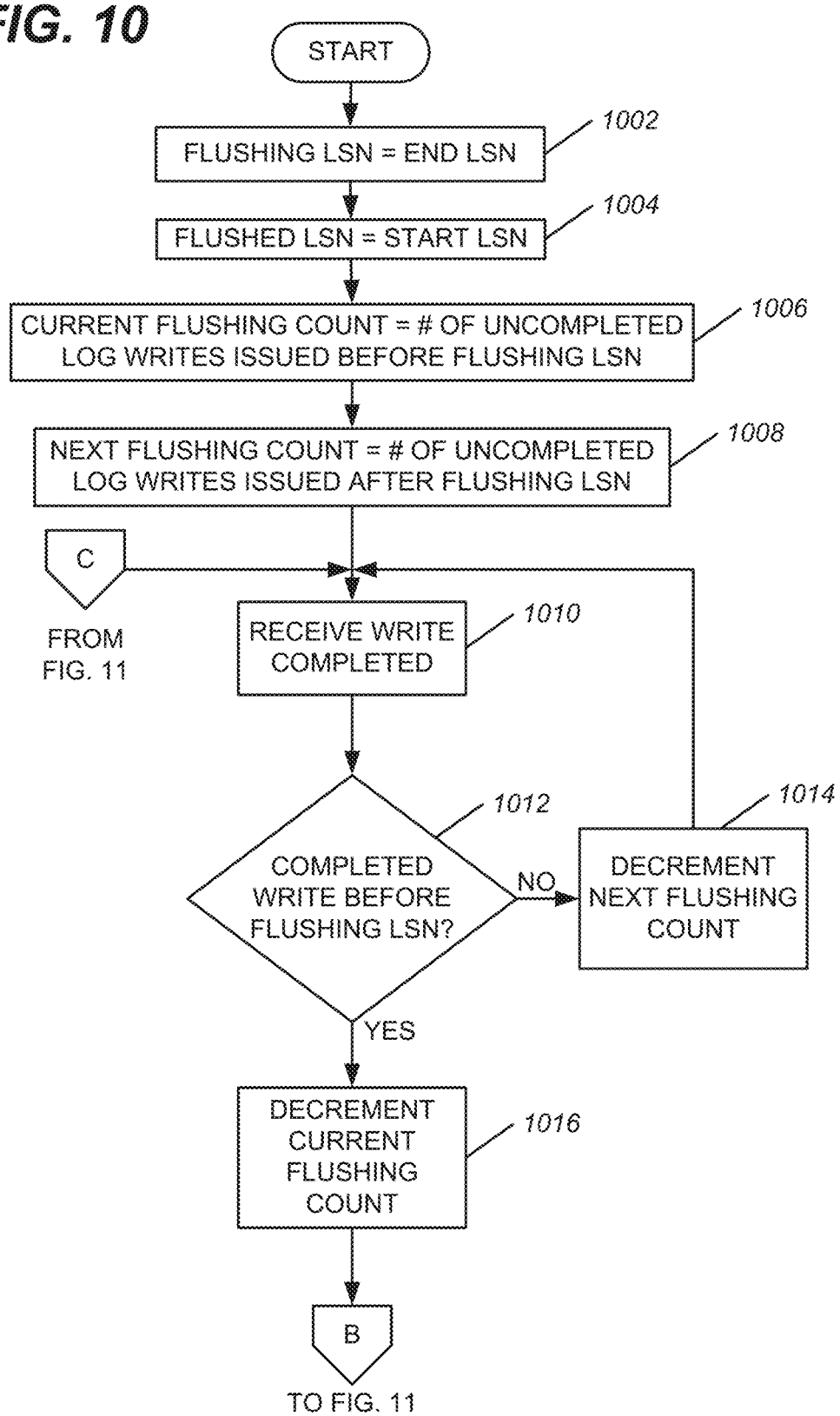
FIGS. 10 and 11 are flowcharts illustrating an exemplary process for keeping track of flushed entries of the write log.
Figure 11:
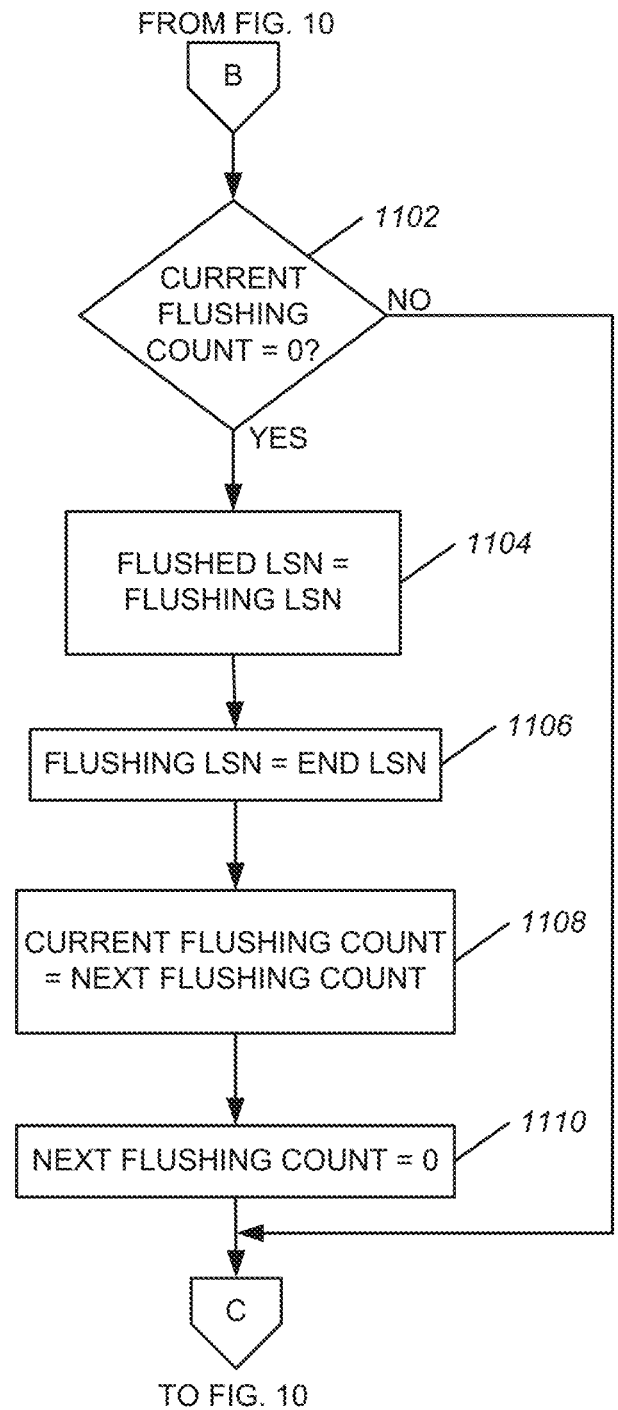

FIGS. 10 and 11 are flowcharts illustrating an exemplary process for keeping track of a flushed LSN in a write log. The process may begin with the processing device initializing flushing LSN to end LSN (act 1002) and flushed LSN to start LSN (act 1004) before any writes to the log occurs. A current flushing count may be a number of uncompleted writes to the write log issued before flushing LSN. Current flushing count may be initialized to zero (act 1006). Next flushing count may be a number of uncompleted writes to the write log issued after flushing LSN. Next flushing count may be initialized to zero (act 1008).

Next, a write complete may be received with respect to a write to the write log (act 1010). The processing device may determine whether the write complete is for a write log entry before flushing LSN (act 1012). If not, then the processing device may decrement next flushing count, which may indicate a number of pending writes with respect to entries after flushing LSN (act 1014). The processing device may then repeat acts 1010-1012.

If, during act 1012, the processing device determines that the write complete is for a write log entry preceding the entry corresponding to flushing LSN, then the processing device may decrement current flushing count (act 1016).

The processing device may then determine whether current flushing count equals zero, indicating that all write log entries preceding the entry corresponding to flushing LSN are completed (act 1102; FIG. 11). If current flushing count equals zero, then the processing device may set flushed LSN to flushing LSN (act 1104). The processing device may then set flushing LSN to be equal to end LSN (act 1106). Alternatively, the processing device may set flushing LSN to be equal to an LSN other than end LSN, such as, for example, an LSN corresponding to an entry that is no more than a predetermined number of entries after flushed LSN. The processing device may then set current flushing count to be equal to next flushing count (act 1108). Next flushing count may then be set to zero (act 1110). Alternatively, if flushing LSN is set to a LSN other than end LSN, then next flushing count may be set to a value indicating a number of pending writes for entries preceding an entry corresponding to flushing LSN. The processing device may again perform act 1010 (FIG. 10).

Figure 12:
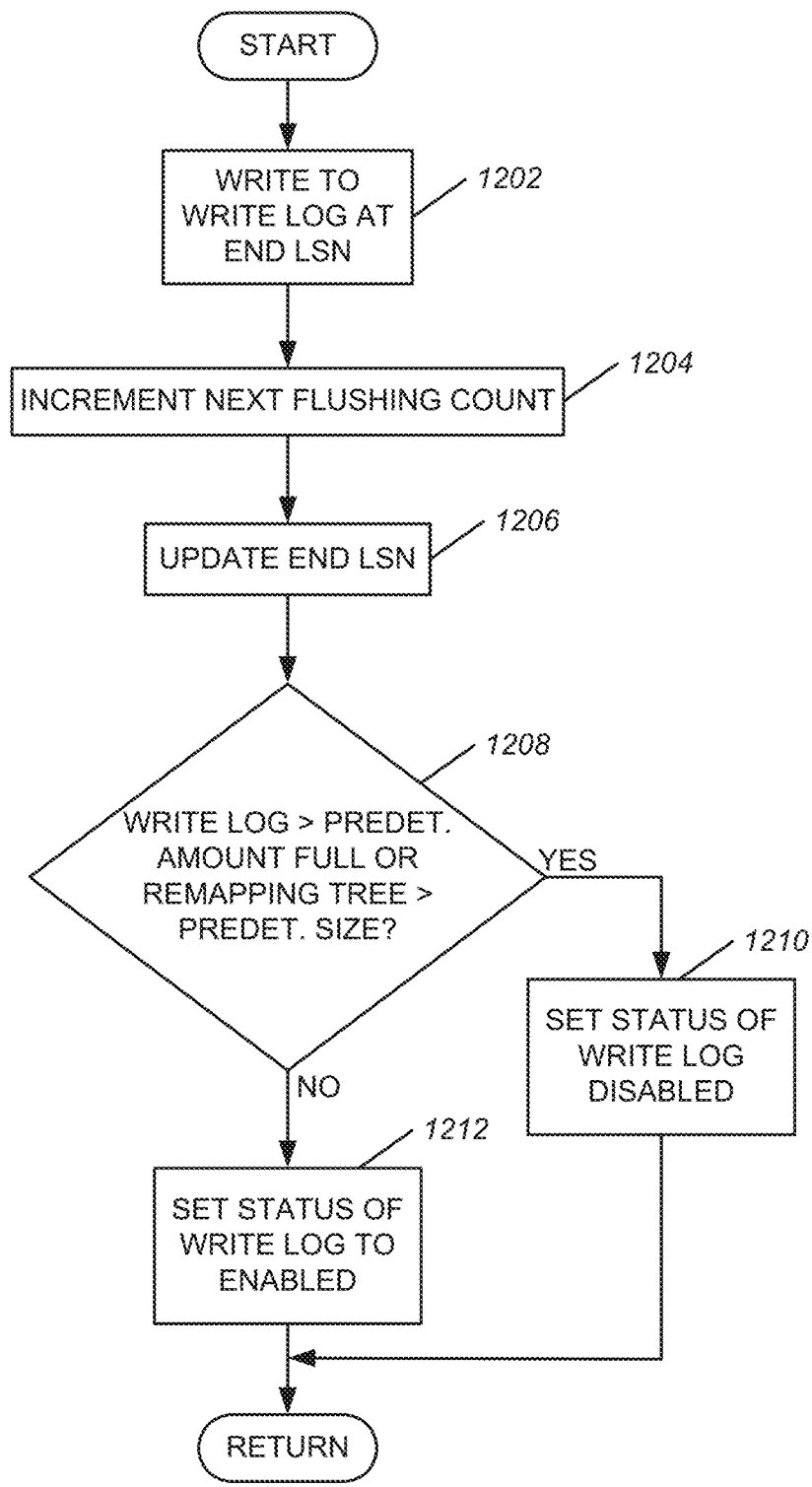
FIG. 12 is a flowchart of an exemplary process for writing to a write log and changing a status of the write log based on how full the write log becomes.

FIG. 12 is a flowchart of an exemplary process for writing to a write log. The process may begin with a processing device issuing a write request to write to the write log at an entry corresponding to end LSN (act 1202). Next, flushing count may be incremented (act 1204) and end LSN may be updated (act 1206). The processing device may then determine whether the write log is greater than a predetermined amount full or whether the remapping tree is larger than a predetermined size (act 1208). If so, then a status of the write log may be set to disabled (act 1210). If the write log is not greater than the predetermined amount full, then the status of the write log may be set to enabled, such that entries, including invalidation records as well as other types of entries, may be added to the write log (act 1212).

Figure 13:
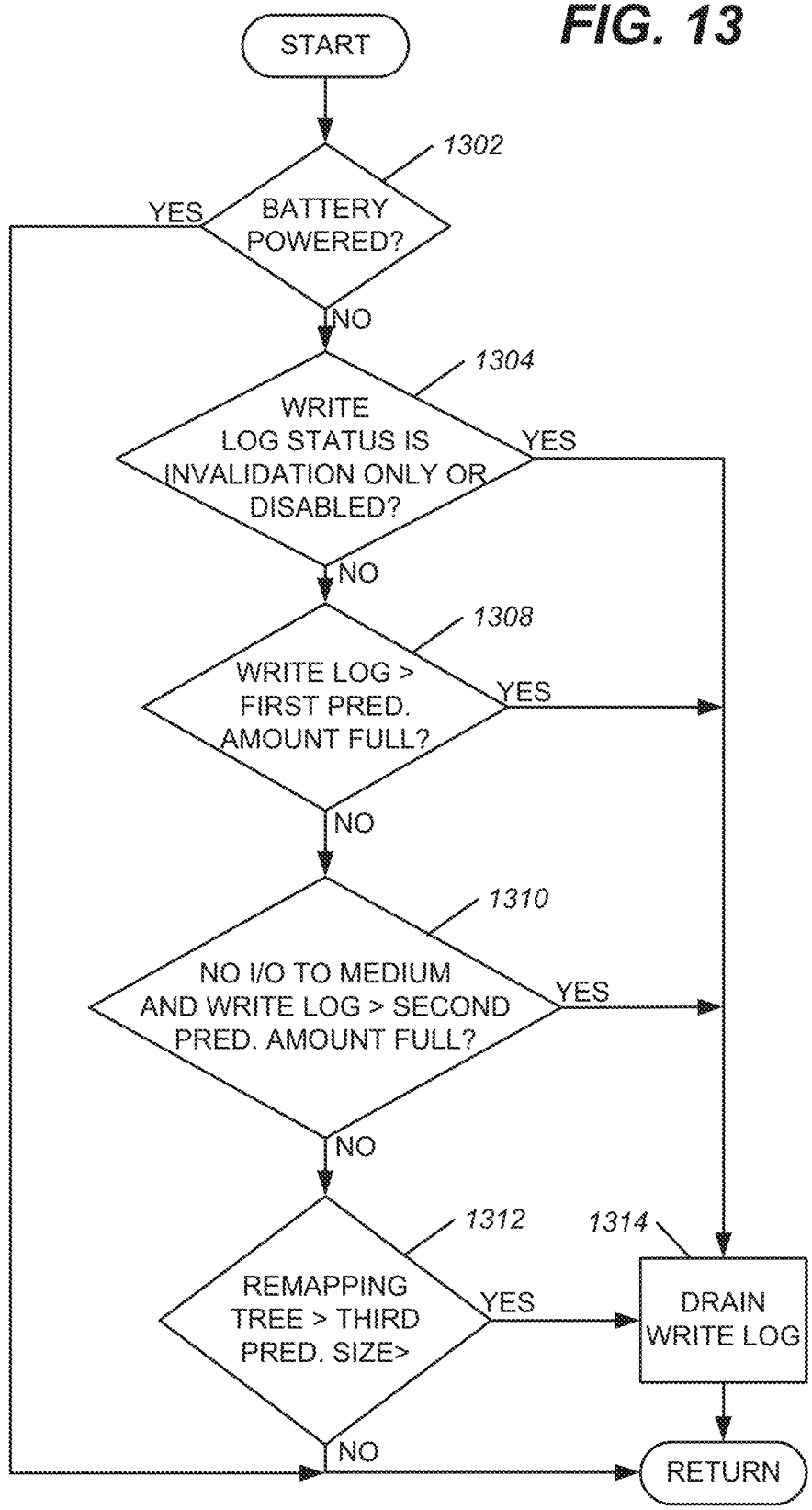
FIG. 13 is a flowchart of an exemplary process for determining whether to drain the write log.

FIG. 13 is a flowchart illustrating an exemplary process for starting draining of the write log. The process may begin with the processing device determining whether the processing device is running on battery power (act 1302). If so, in order to save power, draining may not be performed and the process may be completed.

If, during act 1302, the processing device determines that the processing device is not running on battery power, then the processing device may determine whether a status of the write log is invalidation only or disabled (act 1304). If the status of the write log is invalidation only or is disabled, then the processing device may drain the write log to intended destinations of a random access medium (act 1314).

If, during act 1304, the processing device determines that the status of the write log is not invalidation only and is not disabled, then the processing device may determine whether the write log is more than a first predetermined amount full (act 1308). In some embodiments, the first predetermined amount full may be 67% full. In other embodiments, the first predetermined amount full may be another suitable value. If the write log is more than a first predetermined amount full, then the processing device may drain the write log (act 1314).

If the write log is not more than the first predetermined amount full, then the processing device may determine whether there is no input/output with respect to the random access medium and the write log is greater than a second predetermined amount full, such that the second predetermined amount full is a less than the first predetermined amount full (act 1310). If the processing device determines that there is no input/output with respect to the random access medium and the write log is greater than the second predetermined amount full, then the processing device may drain the write log (act 1314).

If the processing device determines that there is input/output activity with respect to the random access medium or the write log is not greater than the second predetermined amount full, then the processing device may determine whether a remapping tree is larger than a third predetermined size (act 1312). If the remapping tree is larger than the third predetermined size, then the processing device may drain the write log (act 1314).

Figure 14:
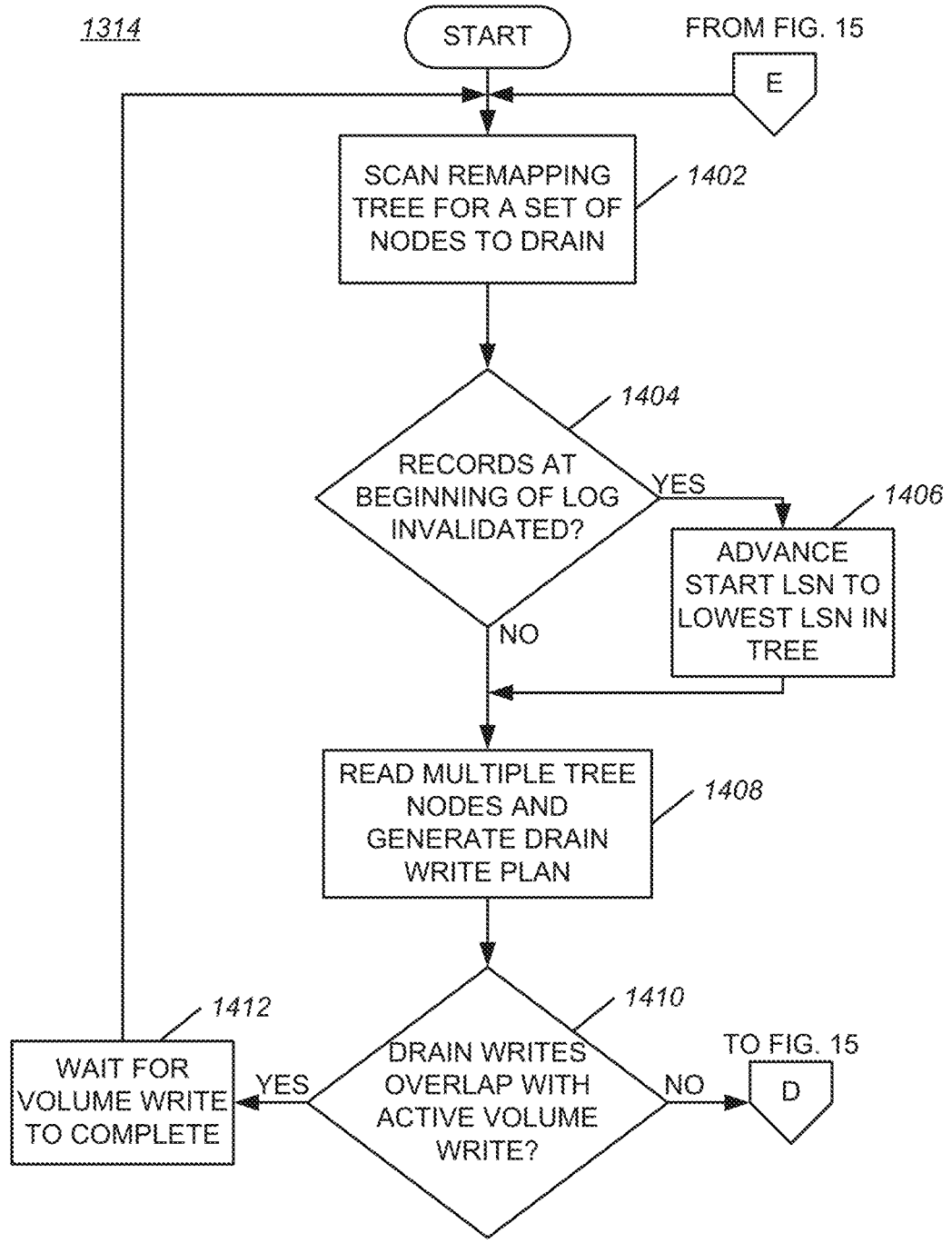
FIGS. 14-16 are flowcharts of an exemplary process for generating a drain write plan for efficiently draining the write log to a random-access medium.
Figure 15:
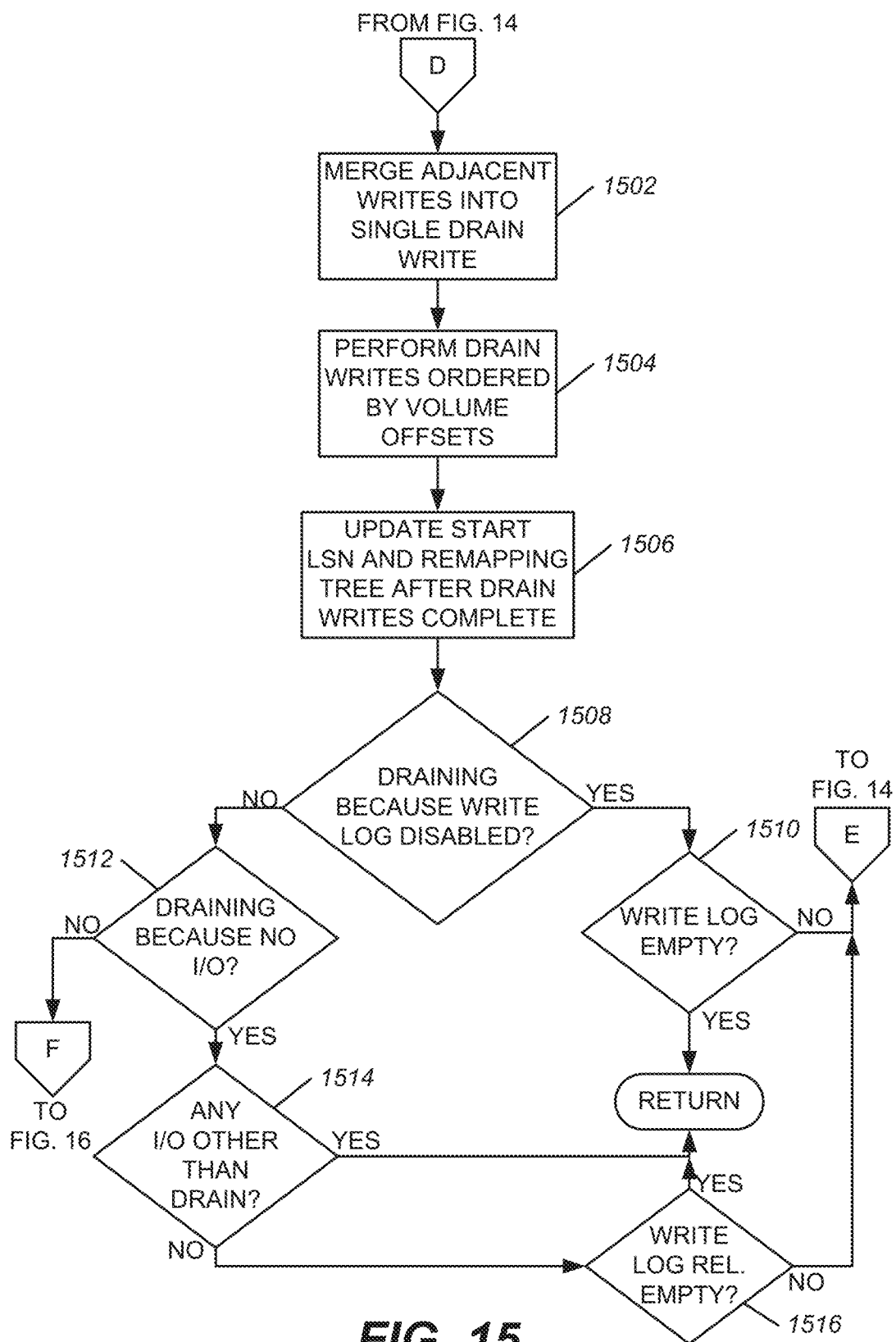
Figure 16:
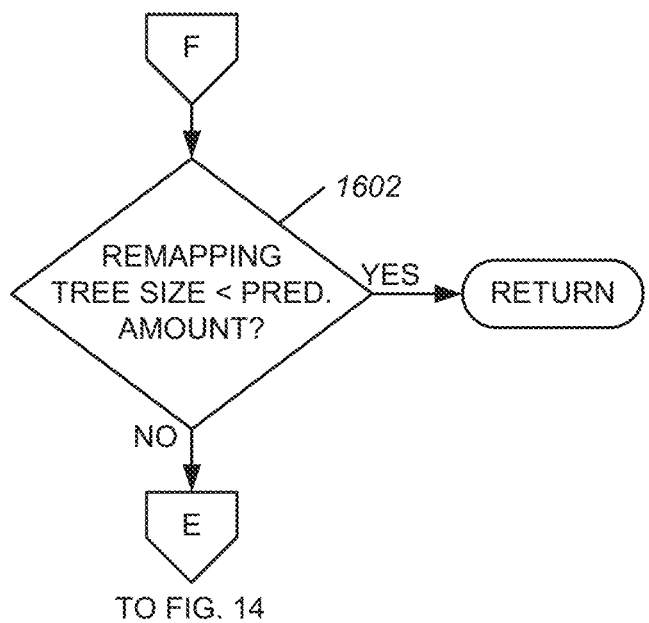

FIGS. 14-16 are flowcharts illustrating an exemplary process for draining the write log, in embodiments consistent with the subject matter of this disclosure. The process may begin with the processing device scanning a remapping tree for a set of nodes, corresponding to entries of the write log, to drain (act 1402). The processing device may then determine whether records at a beginning of the write log have been invalidated (act 1404). If records at the beginning of the write log have been invalidated, then the processing device may advance start LSN to a lowest LSN in the remapping tree that is not invalidated (act 1406).

The processing device may then read multiple nodes of the remapping tree (for example, 20 nodes or another suitable number of nodes) and may generate a drain write plan (act 1408). Only entries of the write log corresponding to LSNs preceding the flushed LSN may be drained. The processing device may then determine whether the drain writes overlap with an active volume write (act 1410). The drain writes overlap with the active volume write when the drain writes and the active volume write are to at least one same LBA of the random access medium. When an overlap is detected, the processing device may wait for the volume write to complete (act 1412) and the processing device may begin the process again by re-performing act 1402.

If, during act 1410, the processing device determines that the drain writes do not overlap with the active volume write, then the processing device may merge adjacent drain writes into a single drain write to reduce inputs and outputs with respect to the random access medium (act 1502; FIG. 15). The processing device may then perform the drain writes in order by volume offsets to minimize seek time (act 1504). After the drain writes complete, the processing device may update start LSN and the remapping tree (act 1506).

Next, the processing device may determine if the draining occurred because the write log was being disabled (act 1508). If so, then the processing device may determine whether the write log is empty (act 1510). If the write log is empty, then the process may be completed. Otherwise, the processing device may again perform act 1402.

If, during act 1508, the processing device determines that draining did not occur because the write log was being disabled, then the processing device may determine whether draining occurred because of no input/output activity with respect to the random access medium (act 1512). If so, the processing device may determine whether there was any input/output activity with respect to the random access medium other than activity related to draining of the write log (act 1514). If so, then the process may be completed. Otherwise, the processing device may determine whether the write log is relatively empty (act 1516). The write log may be determined to be relatively empty when the write log is less than a predetermined amount full, such as, for example, 10%/o or another suitable value.

If, during act 1516, the processing device determines that the write log is not relatively empty, then the processing device may again perform act 1402 (FIG. 14).

If, during act 1512, the processing device determines that draining is not occurring because of no input/output activity with respect to the random access medium, then the processing device may determine whether a remapping tree size is less than a predetermined amount (act 1602; FIG. 16). If so, the process may be completed. Otherwise, the processing device may again perform act 1402 (FIG. 14).

Figure 17:
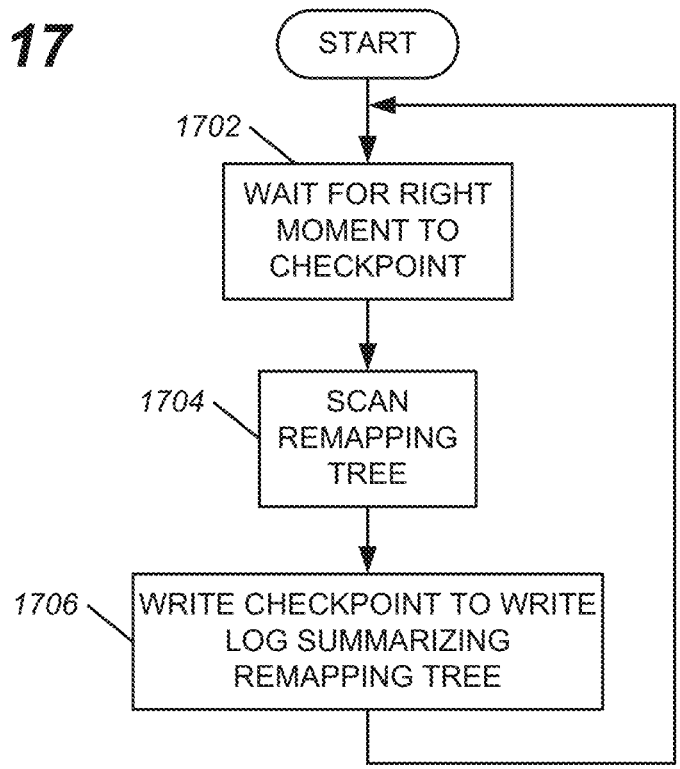
FIG. 17 is a flowchart of an exemplary process for writing a checkpoint to the write log at regular time periods.

FIG. 17 is a flowchart of an exemplary process for writing a checkpoint to the write log. The checkpoint may include information describing all entries of the write log at time intervals. A full checkpoint may be large. Writing a large amount of data may slow down the processing device and may negatively impact a user's experience during the writing of the checkpoint. In some embodiments, a full checkpoint may be divided into a set of smaller incremental checkpoints. Each of the incremental checkpoints may point to a previous incremental checkpoint. Traversing previous incremental checkpoints may, in effect, provide information corresponding to a full checkpoint. The traversing of previous checkpoints terminates at a write log entry corresponding to Start LSN because no write log entries exist before the write log entry corresponding to Start LSN. A full checkpoint may be equivalent to an incremental checkpoint with only one node in a linked list of checkpoints. In a following context, checkpoint refers to an incremental checkpoint because a full checkpoint may be viewed as a special case of an incremental checkpoint.

The process may begin with the processing device waiting for a right moment to write a checkpoint to the write log describing a log range after a previous checkpoint yet before a flushed LSN (act 1702). For example, the right moment may be decided based on write log space not checkpointed since the previous checkpoint, whether a shutdown is initiated, bad sectors exist in non-checkpointed write log space, or other conditions. Next, the processing device may scan a remapping tree, which maps LBAs of a volume of a random access medium to entries in the write log (act 1704). The processing device may then create a checkpoint summarizing the remapping tree, may write the checkpoint to an entry of the write log corresponding to the end LSN, and may update the end LSN (act 1706). The processing device may then repeat acts 1702-1706. Note that only information regarding entries of the write log before the flushed LSN may be recorded in a checkpoint.

Figure 18:
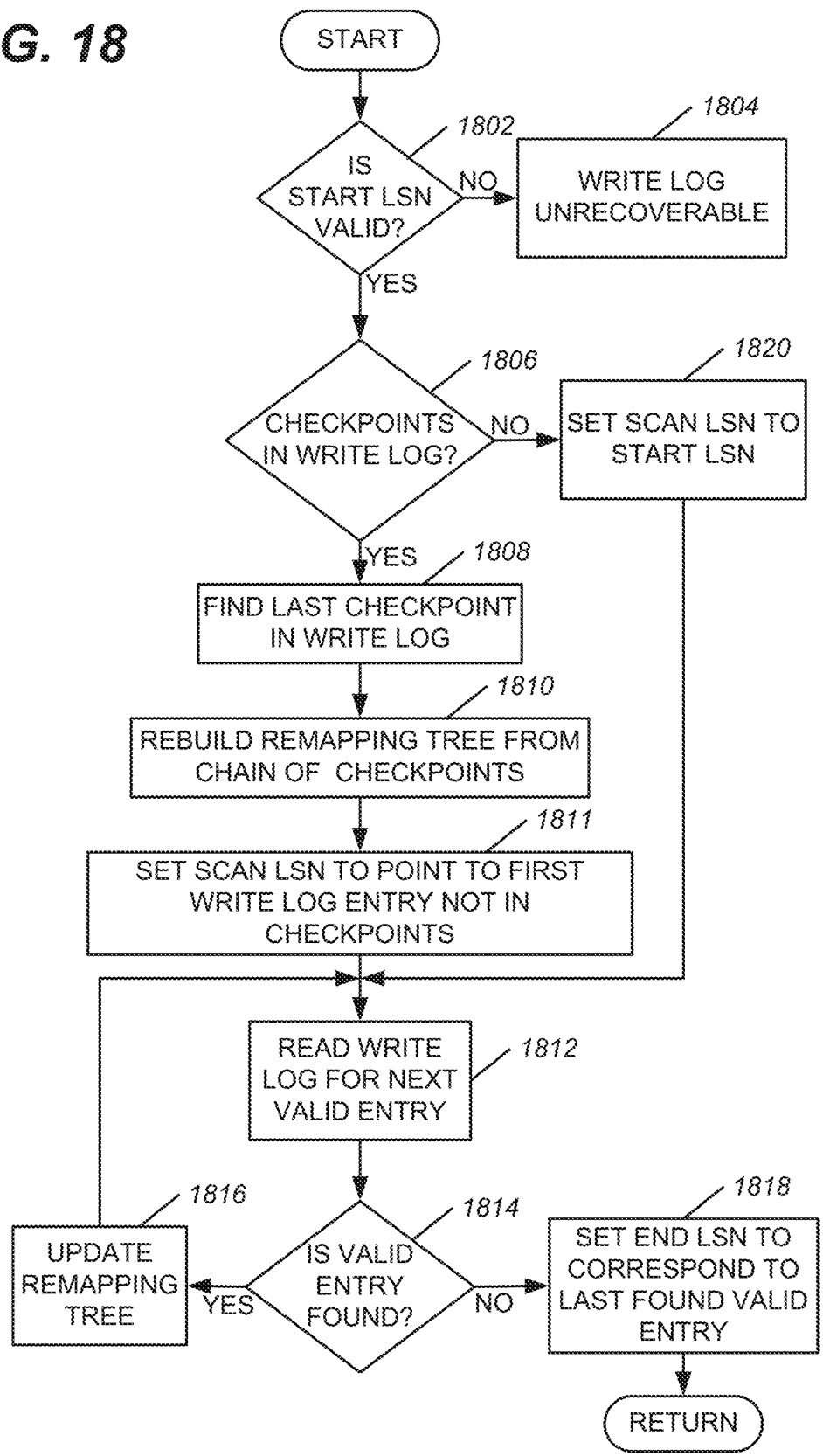
FIG. 18 is a flowchart of an exemplary process for recovering the write log after a dirty shutdown.

A dirty shutdown may be an unexpected shutdown or system crash. FIG. 18 is a flowchart illustrating an exemplary process for recovering from a dirty shutdown. In some embodiments, a normal shutdown may be treated in a same manner as a dirty shutdown, except that a checkpoint may be written before a normal system shutdown to minimize an amount of log space to scan after a reboot.

The process may begin with the processing device obtaining a start LSN from either a first control area or a second control area of a write log and determining whether the start LSN is valid (act 1802). The processing device may determine whether the start LSN is valid by reading a write log entry corresponding to the start LSN and determining whether a checksum for the write log entry is valid, by checking another field of the write log entry for an expected value or a predictable value, or by other methods. If the start LSN is determined not to be valid, then the write log may be considered unrecoverable and a notification to that effect may be provided (act 1804).

If the start LSN is determined to be valid, then the processing device may determine whether any checkpoints exist in the write log (act 1806). In some embodiments, a pointer to a last checkpoint may be stored in the first control area and the second control area of the write log. In such embodiments, the pointer may be obtained and the last checkpoint of a chain of checkpoints may be read and validated. In other embodiments, the processing device may scan the write log, beginning at an entry corresponding to the start LSN, to search for checkpoint entries, until no other valid entries of the write log may be found.

If at least one checkpoint exists in the write log, then the processing device may find a last checkpoint of the chain of checkpoints in the write log (act 1808). The processing device may then rebuild a remapping tree based on the chain of checkpoints by traversing all the checkpoints until a write log entry corresponding to Start LSN is hit. (act 1810). Scan LSN may then be set to correspond to a first write log entry not described by any of the checkpoints (act 1811).

If, during act 1806, the processing device determines that no checkpoints exist in the write log, then the processing device may set Scan LSN to Start LSN (act 1820). After performing act 1810 or act 1820, the processing device may then read a next valid entry after corresponding to the scan LSN (act 1812). In some embodiments, one or more invalid entries of the write log may exist between valid entries of the write log. The processing device may then determine whether a valid entry was found (act 1814). If a valid entry was found, then the processing device may update the remapping tree (act 1816) and may again perform acts 1812-1814. If, during act 1814, the processing device determines that a valid entry of the write log was not found, then the processing device may set end LSN to correspond to the last found valid entry of the write log (act 1818). The process may then be completed.

CONCLUSION

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above descriptions may contain specific details, they are not be construed as limiting the claims in any way. Other configurations of the described embodiments are part of the scope of this disclosure. Further, implementations consistent with the subject matter of this disclosure may have more or fewer acts than as described with respect to FIGS. 7, 8 and 10-18, or may implement acts in a different order than as shown. Accordingly, the appended claims and their legal equivalents define the invention, rather than any specific examples given.

We claim as our invention:

1. A method performed on a computing device, the method comprising:
   receiving, by the computing device, a request to write data to an intended destination on a storage medium;
   redirecting, by the computing device, the data to an alternate destination, where the redirected data is written to the alternate destination, as opposed to the intended destination per the received request;
   determining whether the computing device is operating on battery power and whether a write log associated with the alternate destination is disabled; and
   draining, by the computing device, the redirected data to the intended destination responsive to the determinations that the computing device is not operating on battery power and the write log is disabled.

2. The method of claim 1 where the draining is further based on a status of the alternate destination not indicating that only invalidation records can be written to the alternate destination.

3. The method of claim 1 where the draining is further based on the alternate destination being more than a predetermined amount full.

4. The method of claim 1 where the draining is further based on input/output activity with respect to the intended destination or the alternate destination is not greater than a predetermined amount.

5. The method of claim 1 where the draining is further based on a remapping structure being larger than a predetermined size, where the remapping structure maintains a mapping between the intended destination and the alternate destination.

6. The method of claim 1 where the redirecting is in response to determining, based on a pattern of write requests including the received write request, that the data is suitable for being redirected to the alternate destination.

7. A system comprising:
   a computing device that includes at least one processor and memory;
   computer-executable instructions stored in the memory that, based on execution by the at least one processor, configure the system to perform actions comprising:
   receiving, by the computing device, a request to write data to an intended destination on a storage medium;
   redirecting, by the computing device, the data to an alternate destination, where the redirected data is written to the alternate destination as opposed to the intended destination per the received request;
   determining whether the computing device is operating on battery power and whether a write log associated with the alternate destination is disabled; and
   draining, by the computing device, the redirected data to the intended destination responsive to the determinations that the computing device is not operating on battery power and the write log is disabled.

8. The system of claim 7 where the draining is further based on a status of the alternate destination not indicating that only invalidation records can be written to the alternate destination.

9. The system of claim 7 where the draining is further based on the alternate destination being more than a predetermined amount full.

10. The system of claim 7 where the draining is further based on input/output activity with respect to the intended destination or the alternate destination is not greater than a predetermined amount.

11. The system of claim 7 where the draining is further based on a remapping structure being larger than a predetermined size, where the remapping structure maintains a mapping between the intended destination and the alternate destination.

12. The system of claim 7 where the redirecting is in response to determining, based on a pattern of write requests including the received write request, that the data is suitable for being redirected to the alternate destination.

13. At least one machine-readable storage medium comprising:
   memory that comprises instructions that, based on execution by at least one processor of a computing device, configure the computing device to perform actions comprising:
   receiving, by the computing device, a request to write data to an intended destination on a storage medium;
   redirecting, by the computing device, the data to an alternate destination, where the redirected data is written to the alternate destination as opposed to the intended destination per the received request;
   determining whether the computing device is operating on battery power and whether a write log associated with the alternate destination is disabled; and
   draining, by the computing device, the redirected data to the intended destination responsive to the determinations that the computing device is not operating on battery power and the write log is disabled.

14. The at least one machine-readable storage medium of claim 13 where the draining is further based on the alternate destination being more than a predetermined amount full.

15. The at least one machine-readable storage medium of claim 13 where the draining is further based on input/output activity with respect to the intended destination or the alternate destination is not greater than a predetermined amount.

16. The at least one machine-readable storage medium of claim 13 where the draining is further based on a remapping structure being larger than a predetermined size, where the remapping structure maintains a mapping between the intended destination and the alternate destination.

17. The at least one machine-readable storage medium of claim 13 where the redirecting is in response to determining, based on a pattern of write requests including the received write request, that the data is suitable for being redirected to the alternate destination.

* * * * *